United States Patent [19]
Shirata

[11] Patent Number: 5,977,810
[45] Date of Patent: Nov. 2, 1999

[54] CLOCK DRIVER CIRCUIT AND SEMICONDUCTOR INTEGRATED CIRCUIT DEVICE

[75] Inventor: Masaya Shirata, Tokyo, Japan

[73] Assignee: Mitsubishi Denki Kabushiki Kaisha, Tokyo, Japan

[21] Appl. No.: 08/927,485

[22] Filed: Sep. 11, 1997

[30]     Foreign Application Priority Data

Mar. 3, 1997  [JP]  Japan ................................... 9-047913

[51] Int. Cl.[6] .................................................. G06F 1/04
[52] U.S. Cl. ........................... 327/293; 327/296; 327/297
[58] Field of Search .................................. 327/291, 292, 327/293, 295, 296, 297, 415; 326/41, 100, 101, 102, 103

[56]                References Cited

U.S. PATENT DOCUMENTS

| | | | |
|---|---|---|---|
| 4,661,721 | 4/1987 | Ushiku | 327/297 |
| 5,045,725 | 9/1991 | Sasaki et al. | 326/37 |
| 5,079,614 | 1/1992 | Khatakhotan | 357/42 |
| 5,327,018 | 7/1994 | Karlish et al. | 327/415 |
| 5,355,004 | 10/1994 | Saitoh | 257/211 |
| 5,444,276 | 8/1995 | Yokota et al. | 257/207 |
| 5,497,109 | 3/1996 | Honda et al. | 326/93 |
| 5,578,938 | 11/1996 | Kazami | 326/16 |
| 5,619,048 | 4/1997 | Yokota et al. | 257/207 |

FOREIGN PATENT DOCUMENTS

| | | |
|---|---|---|
| 61-226943 | 10/1986 | Japan . |
| 6-236923 | 8/1994 | Japan . |
| 7-014994 | 1/1995 | Japan . |
| 7-168735 | 7/1995 | Japan . |

*Primary Examiner*—Kenneth B. Wells
*Assistant Examiner*—Hai L. Nguyen
*Attorney, Agent, or Firm*—Burns, Doane, Swecker & Mathis, LLP

[57]                ABSTRACT

A clock driver circuit includes a first and a second clock driver 15a and 15b. In each of these clock drivers, a plurality of main drivers 19(1) through 19(n) have their input nodes and output nodes connected respectively to a first and a second common line 18 and 21. The second common line 21 is connected to a plurality of clock signal supply lines 20(1) through 20(m) which in turn are connected to the clock input nodes of second macro cells 16 each requiring a clock signal. In a test mode, the clock signal supply lines 20a(1) through 20a(m) of the first clock driver 15a are connected respectively to the clock signal supply lines 20b(1) through 20b(m) of the second clock driver 15b by connection means 22. Thus, a clock driver circuit is provided which offers high driving ability with negligible clock skews in both normal mode and test mode.

15 Claims, 13 Drawing Sheets

CLOCK DRIVER CIRCUIT AND SEMICONDUCTOR INTEGRATED CIRCUIT DEVICE

This application is based on Japanese Patent Application No. Hei 9-047913, filed on Mar. 3, 1997, which is incorporated by reference in its entirety herein.

BACKGROUND OF THE INVENTION

1. Field of the Invention

The present invention relates to a semiconductor integrated circuit device such as a gate array or an ECA (embedded cell array) and, more particularly, to a clock driver circuit furnished in that semiconductor integrated circuit device.

2. Background Art

In semiconductor integrated circuit devices including gate arrays and ECA's, the devices' core region has two kinds of macro cells formed therein: a plurality of macro cells acting as logic circuits such as AND or OR circuits, and a plurality of macro cells acting as circuits such as flip-flop circuits each requiring a clock signal. Clock driver circuits are furnished to supply clock signals to such multiple flip-flop circuits.

One way to form the clock driver circuit and to have the circuit included in a semiconductor integrated circuit is illustratively proposed in Japanese Patent Laid-Open No. Hei 6-236923 (U.S. Pat. No. 5,444,276). As shown in FIG. 22, the clock driver circuit typically comprises a predriver PD and a plurality of main drivers MD1 through MDn. The input nodes of the main drivers MD1 through MDn are connected by a common line L1, and their output nodes are connected by a common line L2.

The clock driver circuit is arranged as shown in FIG. 23. Specifically, the plurality of main drivers MD1 through MDn are formed in macro cell layout regions MCR between a power supply line VDD1 and a ground line GND1 constituting a power supply line pair. The power supply line VDD1 is fed with a supply potential, and the ground line GND1 is arranged adjacent to and in parallel with the power supply line VDD1 and is supplied with a ground potential.

The common lines L1 and L2 are each formed between the power supply line VDD1 and ground line GND1 making up the power supply line pair and are arranged in parallel therewith. The common lines L1 and L2 are connected electrically via through holes TH1 and TH2 to the input and output nodes of the main drivers MD1 through MDn. The common line L1 is connected electrically to the output node of the predriver PD via a through hole TH3.

Flip-flop circuits FF formed in the macro cell layout regions MCR each need to be supplied with a clock signal. For that purpose, the clock input nodes of the flip-flop circuits FF are electrically connected via wiring LL to clock signal supply lines CL1 through CLm which in turn are connected electrically to the common line L2.

Each of the clock signal supply lines CL1 through CLm intersects perpendicularly the power supply line VDD1 and ground line GND1 in a wiring region WR, and is located along the corresponding macro cell layout region MCR. Each of the clock signal supply lines CL1 through CLm is electrically connected via a through hole TH4 to the common line L2 where the latter intersects the clock signal supply line in question.

Each macro cell layout region MCR is flanked by a power supply line VDD2 and a ground line GND2. The two lines VDD2 and GND2 perpendicularly intersect the power supply line VDD1 and ground line GND1 and are electrically connected thereto via through holes TH5 and TH6. A clock driver circuit of the above-described constitution incorporated in a semiconductor integrated circuit device proves to be a clock driver circuit that is easy to lay out and provides high driving ability without increasing the area of the semiconductor substrate.

A semiconductor integrated circuit fed with clock signals having a plurality of frequencies in normal operation may be tested for failure in a so-called scan test. The test in part involves connecting flip-flop circuits inside the circuit by means of scan paths. One way to establish clock signal wiring for the scan test is illustratively proposed in Japanese Patent Laid-Open No. Hei 7-168735.

In normal operation, as shown in FIG. 24, a clock signal A input to a clock A terminal 101 passes through a clock driver A 103, clock A wiring 120 and a switch 111 of a switch circuit 114 to enter a flip-flop circuit 108 in a block 107. A clock signal B input to a clock B terminal 102 passes through a clock driver B 104 of a driving ability change circuit 106, clock B wiring 121 and a switch 112 of the switch circuit 114 to enter a flip-flop circuit 109 in the block 107.

In a scan test, the clock A terminal 101 is not fed with any clock signal. Only the clock B terminal 102 is supplied with the clock signal B, so that a semiconductor integrated circuit 119 is given a single frequency. At this point, the switch 111 is turned off and the switches 112 and 113 are turned on in the switch circuit 114. As a result, the flip-flop circuits 108 and 109 admitting clock signals of a plurality of frequencies in normal operation are switched and connected to the single clock B wiring 121. In this setup, the driving ability change circuit 106 is supplied with a driving ability change signal 105 so as to enhance driving ability to counter new increases in the clock signal wiring load.

The result is that the flip-flop circuits 108 and 109 are fed with the clock signal B having entered the clock B terminal 102 by way of the driving ability change circuit 106, clock B wiring 121, and the switches 112 and 113 of the switch circuit 114. In the semiconductor integrated circuit of the above constitution, clock skews are reduced during the scan test.

The first example shown in FIGS. 22 and 23 is a semiconductor integrated circuit device that receives a single clock signal (gate array, ECA, etc.). The second example in FIG. 24, on the other hand, is merely a generically presented semiconductor integrated circuit and has nothing to show regarding such devices as gate arrays and ECA's. The second example has no mention of any specific constitution of the clock driver A 103 or the driving ability change circuit 106 including the clock driver B 104.

SUMMARY OF THE INVENTION

It is therefore a first object of the present invention to overcome the above-noted and other deficiencies of the prior art and to provide a clock driver circuit having a plurality of clock input terminals each corresponding to a plurality of clock drivers, wherein the plurality of clock drivers each function as a clock driver circuit with high driving ability and small clock skews when a control signal denotes a first state, and wherein the plurality of clock drivers function collectively as a single clock driver circuit with high driving ability and small clock skews when the control signal represents a second state.

It is a second object of the present invention to provide a clock driver circuit pursuant to the first object and supplemented with connection means occupying a minimal area for interconnecting the clock drivers in such a manner that minimizes clock skews between outputs of the clock drivers.

It is a third object of the present invention to provide a semiconductor integrated circuit device such as a gate array or an ECA having a plurality of circuits each requiring a clock signal, the circuits being divided into a plurality of portions, each of the divided portions being furnished with a clock input terminal and a clock driver, wherein the circuits each requiring a clock signal in each divided portion are fed with clock signals with small clock skews when a control signal denotes a first state, and wherein all circuits requiring a clock signal each are supplied with clock signals with small skews when the control signal represents a second state.

It is a fourth object of the present invention to provide a semiconductor integrated circuit device such as a gate array or an ECA having a plurality of circuits each requiring a clock signal, the circuits being divided into a plurality of portions, each of the divided portions being furnished with a clock input terminal and a clock driver, wherein the circuits each requiring a clock signal in each divided portion are fed with clock signals with small clock skews when a control signal denotes a first state, wherein all circuits requiring a clock signal each are all supplied with clock signals with small skews when the control signal represents a second state, and wherein a clock driver circuit for supplying the clock signals is furnished in a cell layout region for each macro cell without reducing the area occupied by other macro cells.

According to one aspect of the invention, a clock driver circuit comprises a plurality of clock input terminals for each receiving a clock signal; and a plurality of clock drivers furnished corresponding to the plurality of clock input terminals.

Each of the plurality of clock drivers includes a predriver with an input node for receiving the clock signal input to the corresponding clock input terminal; a plurality of main drivers; a first common line connected electrically to input nodes of the plurality of main drivers and to an output node of the predriver; a second common line connected electrically to output nodes of the plurality of main drivers; and a plurality of clock signal supply lines connected to clock input nodes of circuits each requiring a clock signal, the plurality of clock signal supply lines being further connected electrically to the second common line.

The clock driver circuit further comprises connection means having a plurality of connectors furnished between the plurality of corresponding clock signal supply lines of the plurality of clock drivers, the plurality of connectors electrically disconnecting the corresponding clock signal supply lines between the plurality of clock drivers when a control signal is found to denote a first state, the plurality of connectors further connecting electrically the corresponding clock signal supply lines of the plurality of clock drivers when the control signal is found to represent a second state.

In another aspect of the present invention, in the clock driver circuit, the main drivers of the plurality of clock drivers are activated when the control signal denotes the first state, and wherein the main drivers of the plurality of clock drivers with the exception of one clock driver are deactivated when the control signal represents the second state.

In another aspect of the present invention, in the clock driver circuit, the plurality of clock drivers are formed on a principal plane of a semiconductor substrate. The first and the second common lines of each of the plurality of clock drivers are arranged linearly in a first direction on the principal plane of the semiconductor substrate. The plurality of clock signal supply lines of each of the plurality of clock drivers are arranged in parallel with one another and in a second direction perpendicularly intersecting the first direction on the principal plane of the semiconductor substrate. And the plurality of main drivers of each of the plurality of clock drivers are arranged predetermined distances apart and in the first direction on the principal plane of the semiconductor substrate.

Further, in the clock driver circuit, the predriver and the plurality of main drivers of each of the plurality of clock drivers are preferably arranged along a single straight line.

Further, in the clock driver circuit, preferably the central portion of each clock signal supply line of each of the plurality of clock drivers is electrically connected to the second common line.

Further, in the clock driver circuit, the plurality of clock drivers are arranged preferably in the second direction on the principal plane of the semiconductor substrate.

According to another aspect of the present invention, a semiconductor integrated circuit device comprises a semiconductor substrate having a plurality of macro cell layout regions arranged in a first direction on a principal plane of the substrate; and a plurality of electrode pairs arranged in a second direction perpendicularly intersecting the first direction in each of the plurality of macro cell layout regions of the semiconductor substrate;

wherein each of the plurality of macro cell layout regions includes a plurality of N-type diffusion areas each oriented in the second direction and a plurality of P-type diffusion areas each oriented in the second direction, the plurality of N-type diffusion areas and the plurality of P-type diffusion areas being formed collectively in the first direction;

wherein each of the plurality of electrode pairs is made up of a first and a second electrode, the first electrode being formed together with an interposing insulation film between a contiguous pair of the plurality of N-type diffusion areas furnished in each of the plurality of macro cell layout regions, the second electrode being formed together with an interposing insulation film between a contiguous pair of the plurality of P-type diffusion areas which are arranged along with the first electrode in the first direction and which are furnished in the macro cell layout region in question;

wherein each of the plurality of electrode pairs and the N- and P-type diffusion layers located on both sides of the electrode pair in question constitute a basic cell;

wherein a first macro cell which is made up of a predetermined number of contiguous basic cells and which acts as a logic circuit is furnished to each of the plurality of macro cell layout regions on the semiconductor substrate;

wherein a second macro cell which is made up of a predetermined number of contiguous basic cells and which acts as a circuit requiring a clock signal is furnished to each of at least two of the plurality of macro cell layout regions;

wherein the plurality of macro cell layout regions on the semiconductor substrate are divided into a plurality of portions, each of the divided portions being provided with a clock driver and a clock input terminal for receiving a clock signal;

wherein each of the clock drivers in the corresponding divided portion comprises:

a predriver composed of a predetermined number of contiguous basic cells furnished to the corresponding macro cell layout region on the semiconductor substrate;

a plurality of main drivers which are composed of a predetermined number of contiguous basic cells, which are arranged along a single straight line with the predrivers, the plurality of main drivers being furnished to each of at least two macro cell layout regions other than those provided with the predrivers on the semiconductor substrate;

a first common line formed linearly in the first direction on the predriver and the plurality of main drivers furnished to the divided portion in question, the first common line being electrically connected to an output node of the predriver and to input nodes of the plurality of main drivers furnished to the divided portion in question;

a second common line formed linearly in the first direction on the predriver and the plurality of main drivers furnished to the corresponding divided portion, the second common line being electrically connected to output nodes of the plurality of main drivers in the corresponding divided portion; and a plurality of clock signal supply lines corresponding to the plurality of macro cell layout regions each having the second macro cells in the corresponding divided portion, the plurality of clock signal supply lines being linearly arranged in the second direction and connected electrically to the second common line, the plurality of clock signal supply lines being further connected electrically to each clock input node of the second macro cells furnished to the corresponding macro cell layout regions; and wherein the semiconductor integrated circuit device further comprises connection means located in interposing fashion between two contiguous clock drivers, the connection means electrically disconnecting the corresponding clock signal supply lines of the two contiguous clock drivers when a control signal is found to denote a first state, the connection means further connecting electrically the corresponding clock signal supply lines of the two contiguous clock drivers when the control signal is found to represent a second state.

Further, in the semiconductor integrated circuit device, preferably one of the clock driver circuit as depicted above is incorporated Other features and advantages of the present invention will become more apparent from the following description taken together with the accompanying drawings.

BEST MODE OF CARRYING OUT THE INVENTION

The best mode of the present invention will hereinafter be described in detail with reference to the accompanying drawings.

First Embodiment

A first embodiment of the present invention will now be described with reference to FIGS. 1 through 18. First to be described below with reference to FIGS. 1 and 2 are the semiconductor substrate and master chip of a semiconductor integrated circuit device such as a gate array or an ECA practiced as the first embodiment of the invention.

Figure 1:
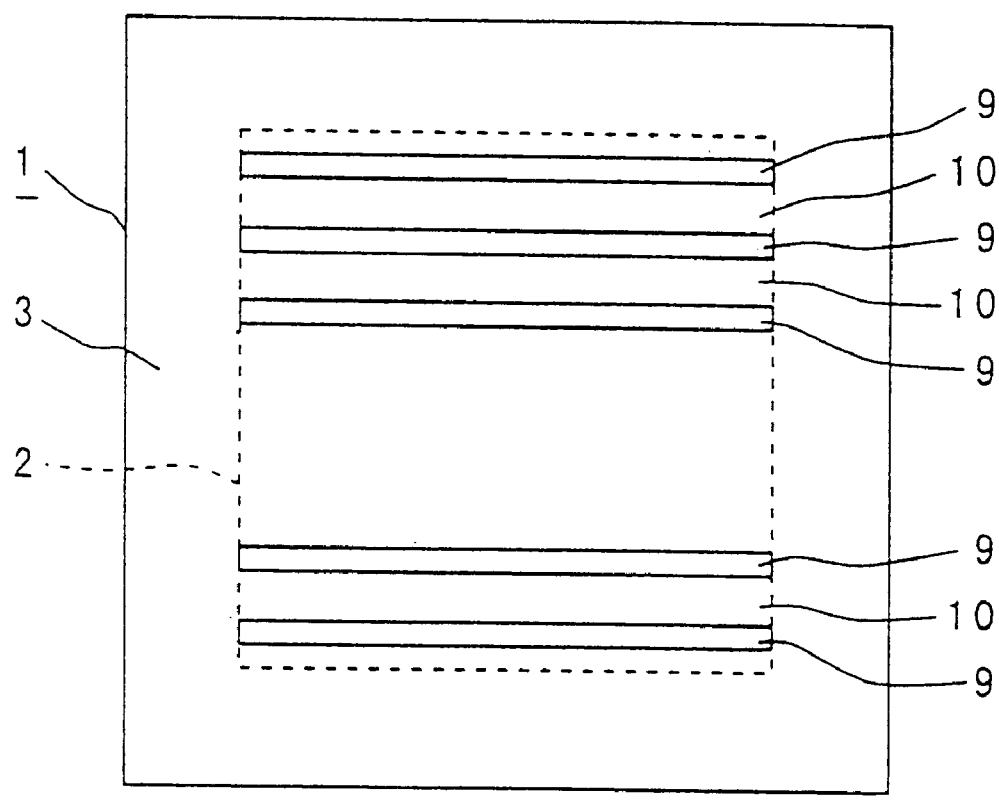
FIG. 1 is a schematic plan view of a master chip used by a semiconductor integrated circuit device according to the present invention.

As shown in FIG. 1, a semiconductor substrate 1 has cell regions (internal or core regions) 2 on a principal plane surrounded by buffer regions (peripheral regions) 3. (It may happen that the semiconductor substrate 1 has cell regions only on the whole principal plane.) In the cell regions 2 on the principal plane of the semiconductor substrate 1, as illustrated in FIG. 2, first electrodes 4 and second electrodes 5 each oriented in a first direction (longitudinally in the figure) make up electrode pairs arranged in a second direction (crosswise in the figure). The electrodes pairs constitute a plurality of electrode pair groups oriented in the first direction.

Figure 2:
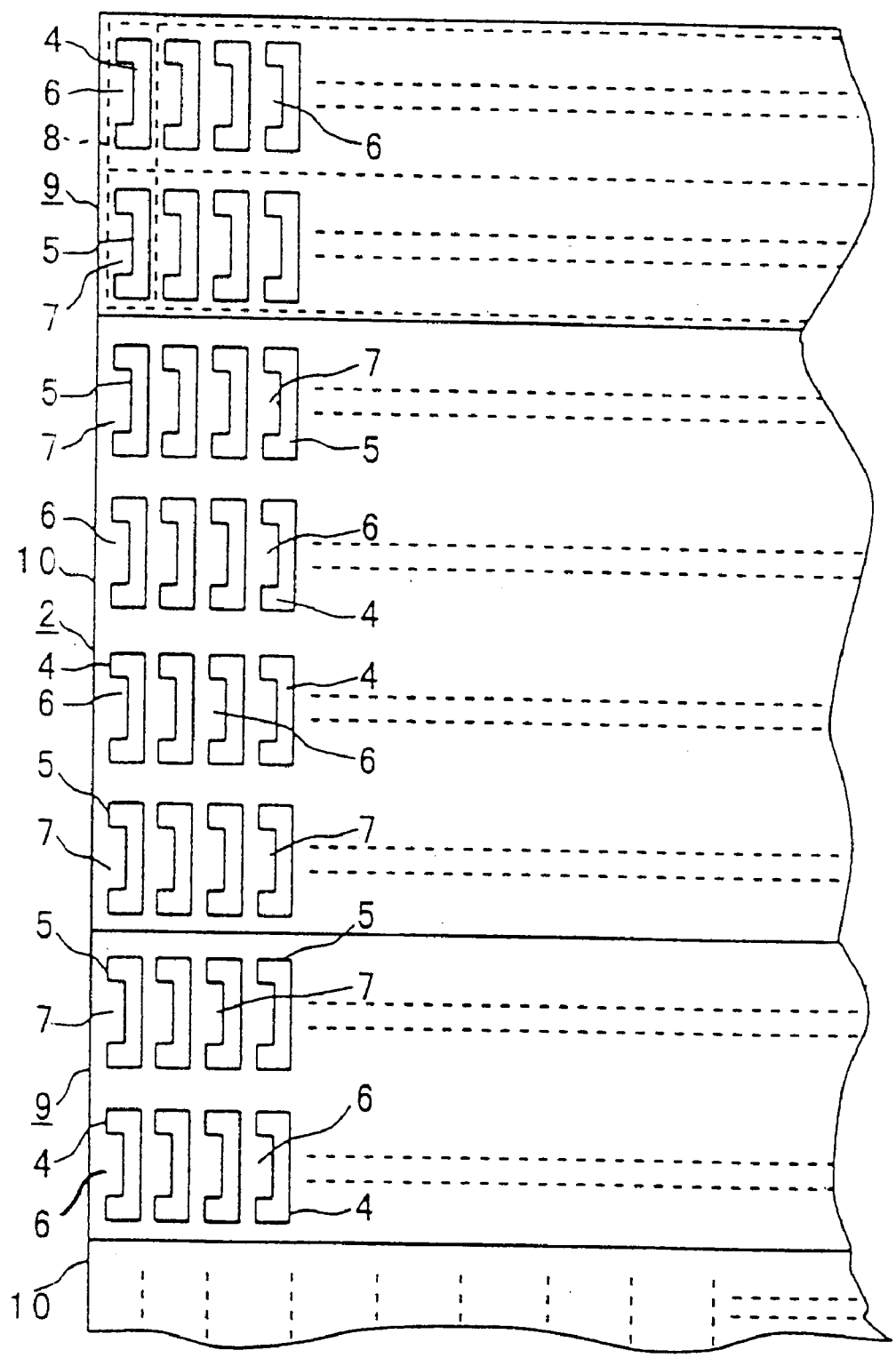
FIG. 2 is a schematic partially enlarged view of the master chip in FIG. 1.

Also in the cell regions 2 on the principal plane of the semiconductor substrate 1, as shown in FIG. 2, a plurality of N-type diffusion areas 6 are oriented in the second direction corresponding to the first electrodes 4 of each electrode pair group. In addition, a plurality of P-type diffusion areas 7 are arranged also in the second direction corresponding to the second electrodes 5 of each electrode pair group. Rows of the P-type diffusion areas 7 are formed, along with the N-type diffusion areas 6 corresponding to the areas 7, collectively in the first direction.

Each first electrode 4 and the two N-type diffusion areas flanking it constitute an N-type MOS transistor, and each second electrode 5 and the two P-type diffusion areas flanking it make up a P-type MOS transistor. One N-type MOS transistor and one P-type MOS transistor arranged in the first direction constitute a basic cell 8.

Each cell region 2 of the semiconductor substrate 1 is filled with basic cells 8 each made up of an N- and a P-type MOS transistor and arranged in the first and the second directions in a matrix fashion. The cell regions 2 of the semiconductor substrate 1, when filled with the basic cells, constitute what is known as a master chip.

Logic circuits such as AND and OR circuits and internal circuits like flip-flop circuits requiring a clock signal each are arranged into cell structures called macro cells, each composed of a predetermined number of basic cells. In the description that follows, each logic circuit is called a first macro cell and each internal circuit requiring a clock signal is called a second macro cell.

In the cell regions 2 of the semiconductor substrate 1, as shown in FIG. 1, a plurality of macro cell layout regions 9 for accommodating a macro cell are each furnished in the first direction. Two macro cell layout regions 9 flank each wiring region 10 for electrically interconnecting the macro cells formed in the macro cell layout regions 9.

Each macro cell layout region 9 is made up of a row of basic cells arranged in the second direction. Each wiring region 10 is composed of one or a plurality of rows of basic cells arranged in the second direction depending on the number of lines formed in the second direction. The buffer regions 3 on the semiconductor substrate 1 accommodate circuits including input buffer circuits, output buffer circuits and input/output buffer circuits.

In the semiconductor integrated circuit device of the above constitution, each second macro cell constituting the internal circuits such as flip-flop circuits requiring clock signals includes a clock driver circuit. Clock driver circuits are used to supply the semiconductor integrated circuit device with external clock signals.

As the semiconductor integrated circuit device becomes larger in scale, there are provided clock driver circuits each having a plurality of function blocks that offer different functions, each function block being fed separately with a clock signal. Where the second macro cells requiring a clock signal each are subjected to a scan test, it is more efficient to put all blocks collectively to the test than to test each function block individually.

The first embodiment of the present invention envisages implementing a semiconductor integrated circuit device of the above constitution. Below is a description of clock driver circuits to be incorporated in such a semiconductor integrated circuit device. For purpose of illustration and simplification, the semiconductor integrated circuit device is assumed to have two function blocks each comprising a second macro cell requiring a clock signal.

Figure 3:
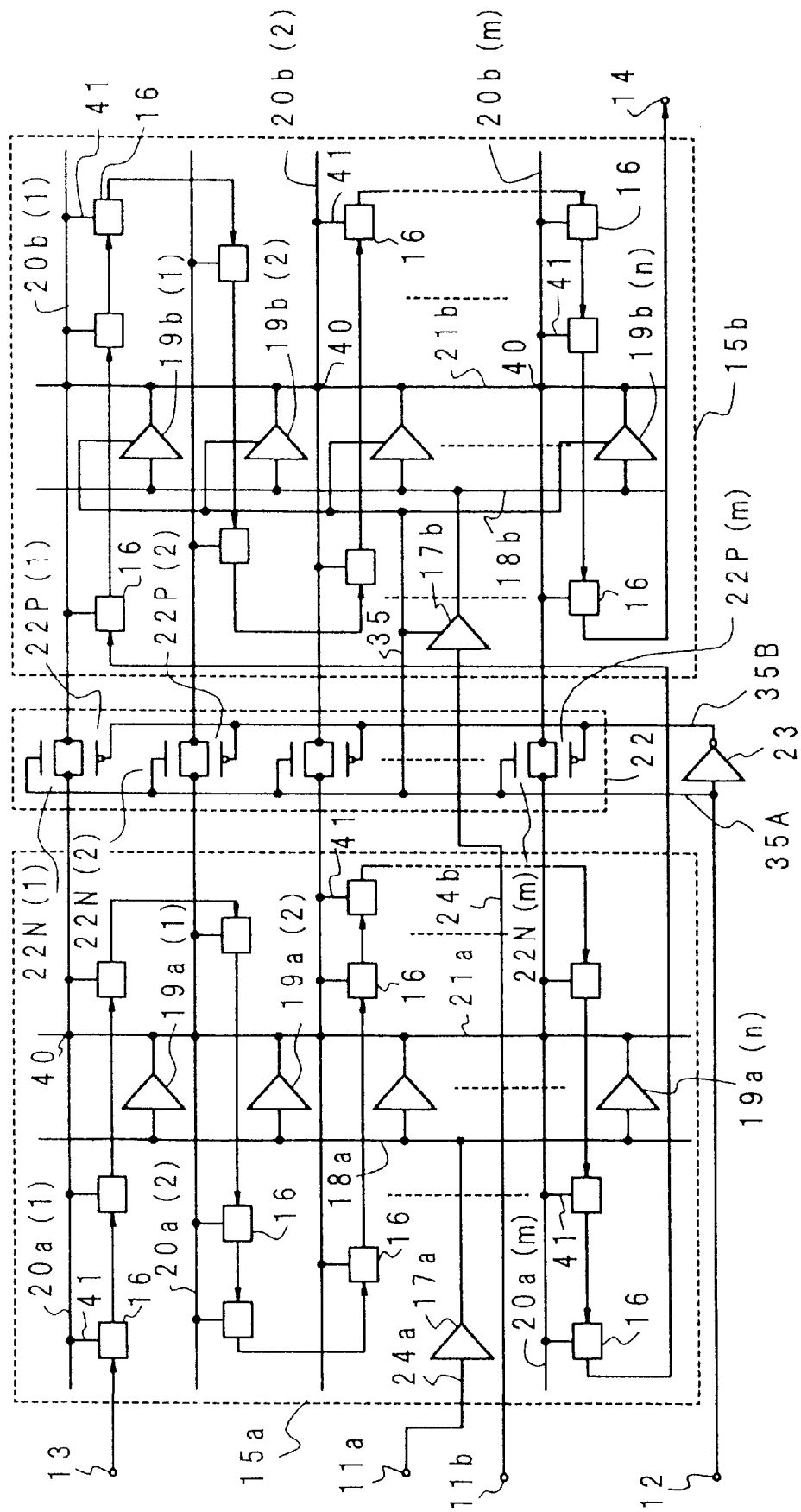
FIG. 3 is a circuit diagram of a first embodiment of the present invention.

Referring to FIG. 3, reference numerals 11a and 11b denote a first and a second clock input terminal. The terminals 11a and 11b, furnished corresponding to each function block, admit separate clock signals CLK1 and CLK2 in normal mode and receive the same test clock signal test-CLK in test mode. Reference numeral 12 stands for a control signal input terminal that admits a control signal test-mode which represents a first state (normal mode, at the Low level with the first embodiment) or a second state (test mode, at the High level with the first embodiment). A scan data input terminal 13 receives scan test data SCAN-IN in test mode. A scan data output terminal 14 outputs scan data SCAN-OUT in test mode.

Reference numerals 15a and 15b denote a first and a second clock driver. The two drivers 15a and 15b correspond to the function blocks each having a plurality of second macro cells 16. Upon receipt of clock signals through the first and second clock input terminals 11a and 11b, the first and second clock drivers supply the clock signals to the multiple second macro cells 16 in the respective function blocks.

Figure 4:
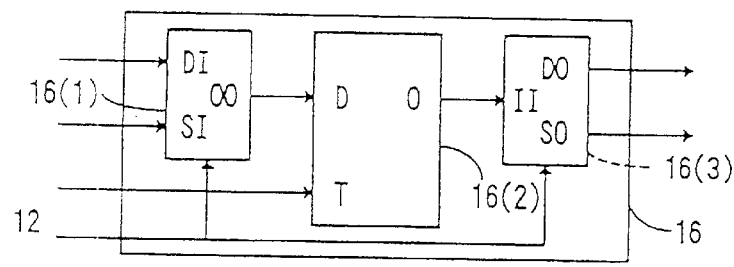
FIG. 4 is a block diagram of a second macro cell 16 shown in FIG. 3.

Each second macro cell 16 illustratively has a constitution shown in FIG. 4. In FIG. 4, reference numeral 16(1) is an input-side selector which, based on the control signal coming from the control signal input terminal 12 and received through a control input node, selects either normal data or scan data. The normal data is received through a data input node D1 in normal mode, and the scan data is admitted through a scan data input node SI in test mode. The data selected by the input-side selector 16(1) is output to a data output node DO.

Reference numeral 16(2) is a circuit such as a flip-flop circuit (generically called a flip-flop circuit hereunder) which, in synchronism with the clock signal coming from the clock driver 15 and received through a clock input node T, admits data from the data output node DO of the input-side selector 16(1) through a data input node D and outputs the data from a data output node O.

Reference numeral 16(3) is an output-side selector which receives the data from the data output node I of the flip-flop circuit 16(1) through a data input node II and, in accordance with the control signal coming from the control signal input terminal 12 and received through the control input node, outputs the data either from the data output node DO in normal mode or from the scan data output node SO in test mode.

Because the first and second clock drivers 15a and 15b have substantially the same circuit constitution, the description that follows will center on the first clock driver 15a as representative of the two with reference to FIG. 3. In this connection, the subscripts a and b of the reference numerals will be omitted where appropriate as they simply identify the individual clock drivers.

Reference numeral 17 is a predriver whose input node IN is electrically connected to the clock input terminal 11 via a clock signal input line 24. The output node OUT of the predriver 17 is connected electrically to a first common line 18. In test mode, all predrivers 17 except one are deactivated. Since the first embodiment has two predrivers 17, the second predriver 17b is deactivated in test mode. Specifically, the output node OUT of the predriver 17b is brought to the high-impedance level (an electrically floating state) so as not to affect the first common line 18b.

Figure 5:
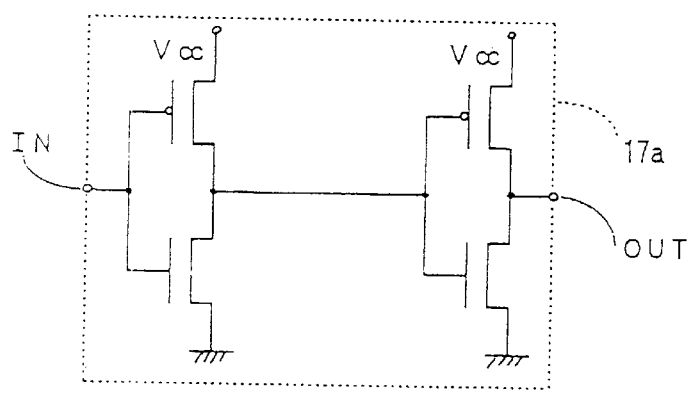
FIG. 5 is a circuit diagram of a predriver 17a shown in FIG. 3.

As shown in FIG. 5, the first predriver 17a typically comprises two inverter circuits connected in series. Each inverter circuit includes a P- and an N-type MOS transistor serially connected.

Figure 6:
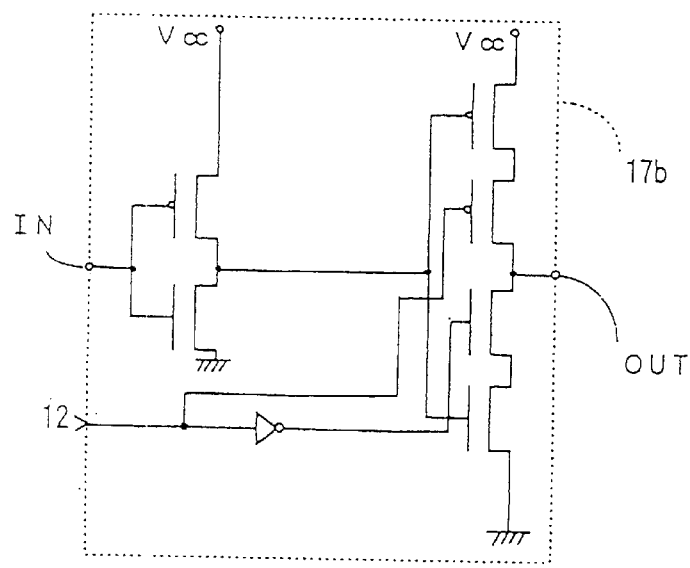
FIG. 6 is a circuit diagram of an example of a predriver 17b shown in FIG. 3.

As depicted in FIG. 6, the second predriver 17b typically comprises an input-side inverter circuit and an output-side inverter circuit. The input-side inverter circuit includes a P- and an N-type MOS transistor connected in series. The output-side inverter is constituted by a P- and an N-type MOS transistor whose gate electrodes receive the output of the input-side inverter circuit, as well as by a P- and an N-type MOS transistor whose gate electrodes receive an inverter-inverted control signal derived from the control signal from the control signal input terminal 12, the P- and N-type MOS transistors being serially connected.

Figure 7:
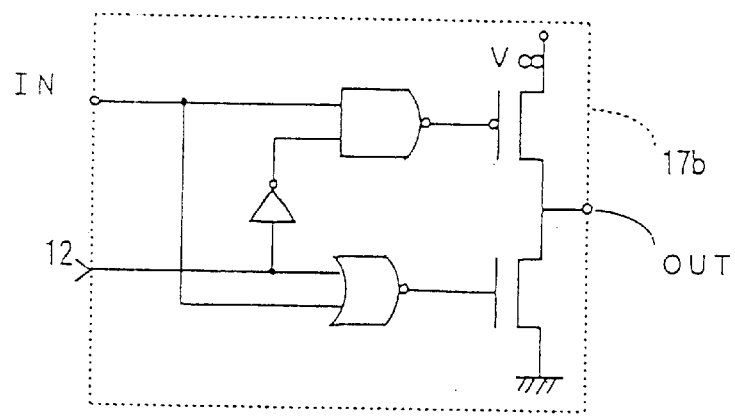
FIG. 7 is a circuit diagram of another example of the predriver 17b shown in FIG. 3.

Alternatively, the second predriver 17b may also be constituted as shown in FIG. 7. This second predriver 17b includes a NAND circuit, a NOR circuit and an output buffer circuit. The NAND circuit admits a clock signal coming from the clock input terminal 11 and input through an input node IN, and an inverter-inverted control signal derived from the control signal from the control signal input terminal 12. The NOR circuit receives the clock signal coming from the clock input terminal 11 and input through the input node IN, and the control signal from the control signal input terminal 12. The output buffer circuit has a P-type MOS transistor and an N-type MOS transistor connected in series, the gate electrode of the P-type MOS transistor receiving the output of the NAND circuit, the gate electrode of the N-type MOS transistor receiving the output of the NOR circuit.

Figure 8:
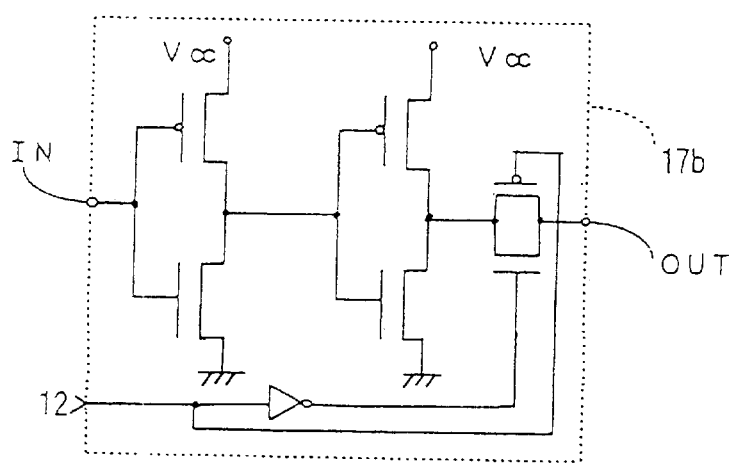
FIG. 8 is a circuit diagram of yet another example of the predriver 17b shown in FIG. 3.

As another alternative, the second predriver 17b may also be constituted as shown in FIG. 8. This predriver has two inverter circuits serially connected, each inverter circuit comprising a P- and an N-type MOS transistor connected in series. The predriver also includes another N-type MOS transistor connected in interposing fashion between the output node of the output-side inverter circuit and an output node OUT, the gate electrode of the N-type MOS transistor receiving the control signal from the control signal input terminal 12.

Returning to FIG. 3, reference numerals 19(1) through 19(n) represent a plurality of main drivers whose input nodes IN are electrically connected to the first common line 18. The output nodes OUT of the main drivers 19(1) through 19(n) are connected electrically to the second common line 21. In turn, the second common line 21 is connected to a plurality of clock signal supply lines 20(1) through 20(m). The lines 20(1) through 20(m) are connected electrically to the clock input nodes of internal circuits (i.e., second macro cells) each requiring a clock signal.

In test mode, the main drivers 19(1) through 19(n) in all clock drivers except one are deactivated. Since the first embodiment has two clock drivers 15, the main drivers 19b(1) through 19b(n) in the second clock driver 15b are deactivated in test mode. The output nodes OUT of the deactivated main drivers are set to the high-impedance level (i.e., electrically floating state) so as not to affect the second common line 21b.

Figure 9:
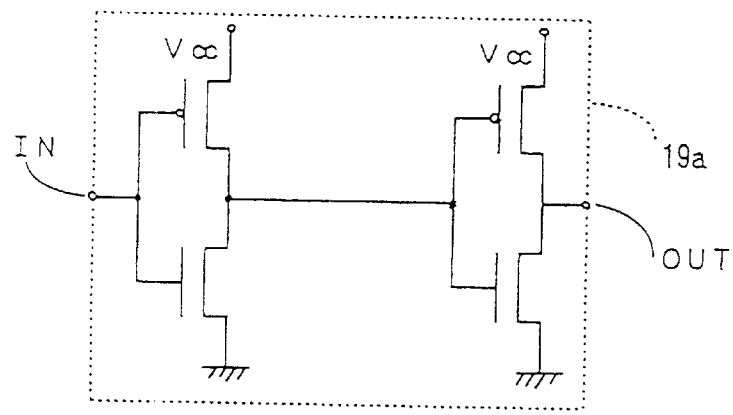
FIG. 9 is a circuit diagram of main drivers 19a(1) through 19a(n) shown in FIG. 3.

Each of the first main drivers 19a(1) through 19a(n) is composed of two inverter circuits, as shown in FIG. 9. Each inverter circuit comprises a P- and an N-type MOS transistor connected in series.

Figure 10:
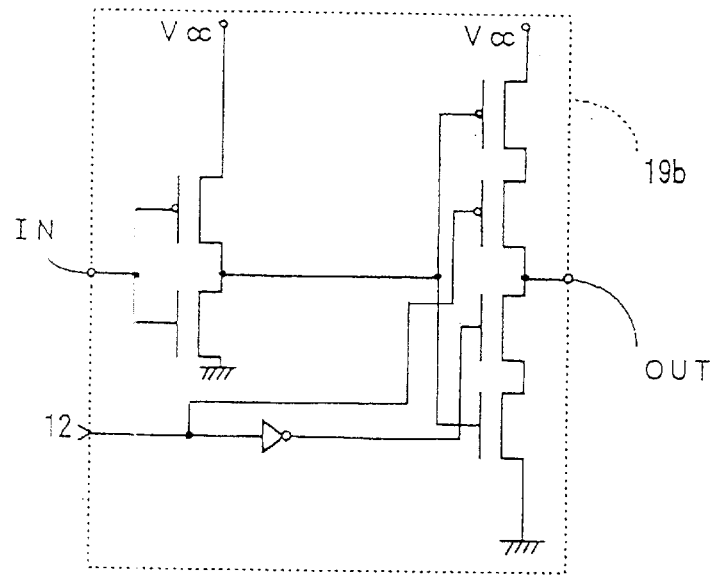
FIG. 10 is a circuit diagram of an example of main drivers 19b(1) through 19b(n) shown in FIG. 3.

As shown in FIG. 10, the second main drivers 19b(1) through 19b(n) are each constituted illustratively by an input- and an output-side inverter circuit. The input-side inverter circuit includes a P- and an N-type MOS transistor serially connected. The output-side inverter circuit comprises a P- and an N-type MOS transistor whose gate electrodes receive the output of the input-side inverter circuit, and a P- and an N-type MOS transistor whose gate electrodes admit an inverter-inverted control signal derived from the control signal from the control signal input terminal 12, the N- and P-type MOS transistors being connected in series.

Figure 11:
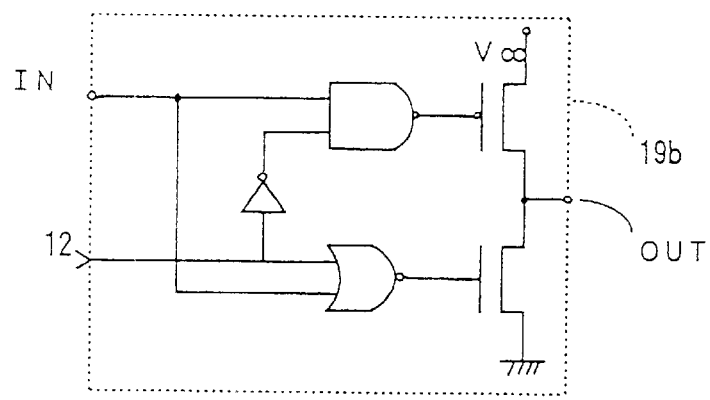
FIG. 11 is a circuit diagram of another example of the main drivers 19b(1) through 19b(n) shown in FIG. 3.

Alternatively, the second main drivers 19b(1) through 19b(n) may each be constituted as shown in FIG. 11. Specifically, each main driver may comprise a NAND circuit, a NOR circuit and an output buffer circuit. The NAND circuit receives the clock signal coming from the clock input terminal 11 and input through a clock input node IN, and an inverter-inverted control signal derived from the control signal from the control signal input terminal 12. The NOR circuit admits the clock signal coming from the clock input terminal 11 and input through the input node IN, and the control signal from the control signal input terminal 12. The output buffer circuit has a P- and an N-type MOS transistor connected in series, the P-type MOS transistor having its gate electrode receiving the output of the NAND circuit, the N-type MOS transistor having its gate electrode admitting the output of the NOR circuit.

Figure 12:
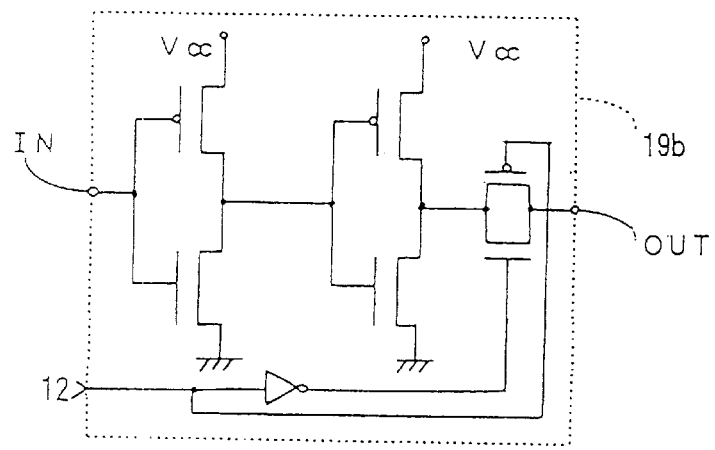
FIG. 12 is a circuit diagram of yet another example of the main drivers 19b(1) through 19b(n) shown in FIG. 3.

As another alternative, the second main drivers 19b(1) through 19b(n) may each be constituted as shown in FIG. 12. Specifically, each main driver has two inverter circuits serially connected, each inverter circuit comprising a P- and an N-type MOS transistor connected in series. Each main driver also includes another N-type MOS transistor connected in interposing fashion between the output node of the output-side inverter circuit and an output node OUT, the gate electrode of the N-type MOS transistor receiving the control signal from the control signal input terminal 12.

Although the predriver 17 and the main drivers 19(1) through 19(n) were each shown being made up of two inverter circuits connected in series, this arrangement is exemplary and should not be construed as limiting the invention. Many more inverter circuits may be combined to form each driver. Preferably, however, the number of inverter circuits constituting each predriver and the number of inverter circuits making up each main driver should be an even number when added up.

Reference numeral 22 denotes connection means furnished in interposing fashion between a plurality of clock signal supply lines 20a(1) through 20a(m) in the first clock driver 15a on the one hand, and a plurality of clock signal supply lines 20b(1) through 20b(m) in the second clock driver 15b on the other hand. When the control signal indicates a first state (Low level), the connection means 22 electrically disconnects the plurality of clock signal supply lines 20a(1) through 20a(m) in the first clock driver 15a, from the plurality of clock signal supply lines 20b(1) through 20b(m) in the second clock driver 15b. When the control signal represents a second state (High level), the connection means 22 electrically connects all of the clock signal supply lines 20a(1) through 20a(m) in the first clock driver 15a to the corresponding clock signal supply lines 20b(1) through 20b(m) in the second clock driver 15b.

The connection means 22 has a plurality of transmission gates furnished corresponding to the clock signal supply lines 20a(1) through 20a(m) in the first clock driver 15a as well as to the clock signal supply lines 20b(1) through 20b(m) in the second clock driver 15b. Each transmission gate comprises a P-channel MOS transistor 22P and an N-channel MOS transistor 22N connected in parallel. One end of each transmission gate (i.e., one source/drain region commonly connected to the P-channel MOS transistor 22P and N-channel MOS transistor 22N) is connected to an end of the corresponding clock signal supply line 20a in the first clock driver 15a; the other end of the transmission gate (i.e., the other source/drain region commonly connected to the P-channel MOS transistor 2P and N-channel MOS transistor 22N) is connected to an end of the corresponding clock signal supply line 20b in the second clock driver 15b. The control electrode of each transmission gate receives the control signal.

The control electrode (gate electrode) of the P-channel MOS transistor 22P receives a control signal inverted by an inverter circuit 23 based on the control signal from the control signal input terminal 12. The control electrode of the N-channel MOS transistor 22N receives the control signal from the control signal input terminal 12. Each transmission gate constitutes each of the connectors making up the connection means 22.

Described below is the clock driver circuit whose circuit constitution is shown in FIG. 3 and which forms the master chip depicted in FIGS. 1 and 2. In the first embodiment, the cell region 2 on the semiconductor substrate 1 is divided into two function block layout regions in the second direction (i.e., crosswise in FIG. 3). The left-hand function block layout region includes the first clock driver 15a, and the right-hand function block layout region comprises the second clock driver 15b.

Because the first and the second clock driver circuits 15a and 15b have substantially the same circuit constitution as described above, the first clock driver circuit 15a alone will be described below as representative of the two. The second clock driver 15b, structurally identical to the first clock driver 15a, is located in the right-hand half of FIG. 3.

Figure 14:
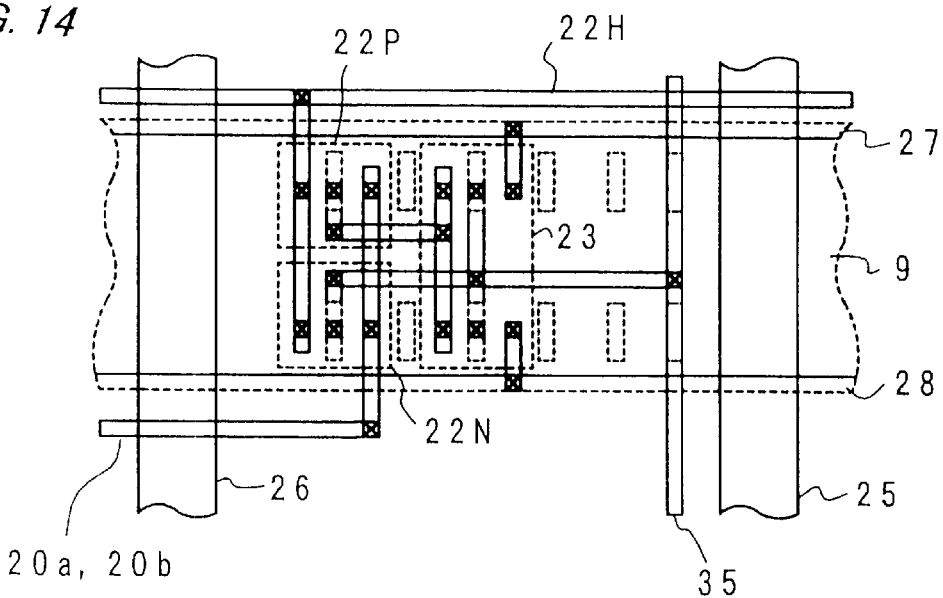
FIG. 14 is a partially enlarged plan pattern view of a predriver 17a shown in FIG. 13.
Figure 15:
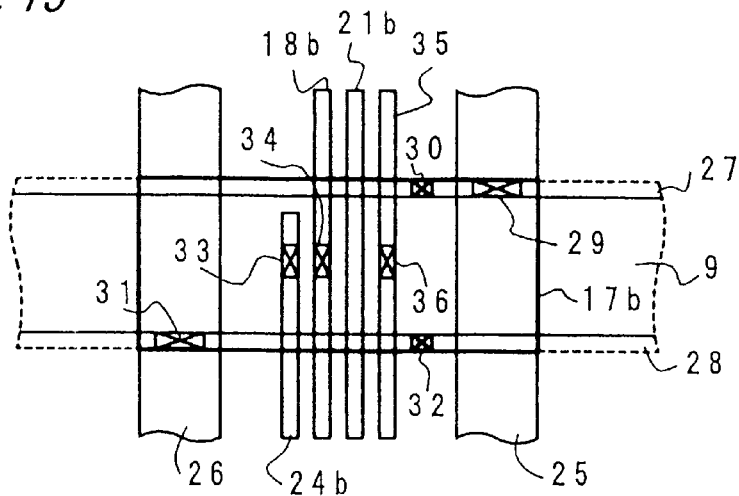
FIG. 15 is a partially enlarged plan pattern view of a predriver 17b shown in FIG. 13.

The predriver 17 is located approximately in the middle of the macro cell layout region 9 which in turn is located approximately in the middle of the function block layout region in question. The first predriver 17a (whose details are shown in FIG. 14, an enlarged view of the portion A1 in FIG. 13) and the second predriver 17b (whose details are depicted in FIG. 15, an enlarged view of the portion A2 in FIG. 13) are each formed, in the corresponding function block layout region, where a power supply pair made of a power supply line 25 and a ground line 26 intersects a macro cell layout region 9, i.e., each predriver 17 is formed in the macro cell layout region 9 between the power supply line 25 and ground line 26 constituting a power supply line pair. Each power supply line pair is formed in the second direction and located approximately in the middle of the corresponding function block layout region.

Power supply line pairs are arranged linearly across the cell region 2 in the first direction on the principal plane of the semiconductor substrate 1, and are formed predetermined distances apart (in units of 210 BC or basic cells; the distance of one basic cell 8 equals its width (in the second direction), 2.65 μm for this embodiment). With the first embodiment, each cell region 2 measures 9 mm in the second direction on the semiconductor substrate 1. This means that each divided region comprises a plurality of power supply line pairs.

As with the wiring inside the logic circuits acting as a first macro cell, wiring inside the internal circuits acting as a second macro cell, wiring between the logic circuits, and wiring between the logic circuits on the one hand and the internal circuits on the other hand, the wiring inside each predriver 17 is constituted by at least one of first and second wiring. The first wiring is arranged linearly in the second direction, and the second wiring is formed linearly in the first direction.

The first wiring is made of a first electrical conductor layer formed together with an interposing interlayer insulation film over the electrode pairs constituting the basic cells 8. The second wiring is made of a second electrical conductor layer formed together with an interposing interlayer insulation film over the first electrical conductor layer. The first and the second electrical conductor layers may switch their positions vertically. The first and the second electrical conductor layers are constituted by aluminum layers (including an aluminum alloy layer).

The power supply line 25 is fed with a supply potential, and the ground line 26 is supplied with a ground potential. The power supply line 25 and ground line 26 making up each power supply line pair are arranged contiguously and in parallel with each other, and are made of the second electrical conductor layer. The power supply line pairs each composed of the power supply line 25 and ground line 26 are arranged linearly across the cell region 2 in the first direction on the principal plane of the semiconductor substrate 1.

With the first embodiment, the distance between the outer periphery of the power supply line 25 and that of the ground line 26 making up each power supply line pair is 46 BC. This means that each predriver 17 may be readily formed between the power supply line 25 and its paired ground line 26.

In FIGS. 14 and 15, the length of the predriver 17 in the second direction is shown ranging from the outer periphery of the power supply line 25 to that of the paired ground line 26. However, this arrangement is exemplary and should not be construed as limiting the invention. Depending on its structure, the predriver 17 may alternatively be shorter than the distance between the outer periphery of the power supply line 25 and that of the paired ground line 26, as long as each predriver 17 is located between the power supply line 25 and the paired ground line 26 constituting each power supply line pair.

As shown in FIGS. 14 and 15, the first and the second predrivers 17a and 17b are each fed with the supply potential Vcc from the power supply line 25 via another power supply line 27; each predriver 17 is also supplied with the ground potential GND from the ground line 26 connected to the predriver via another ground line 28. The power supply lines 27 are furnished all over the macro cell layout regions 9 in the second direction on one side of the regions (top side in FIGS. 14 and 15). The power supply lines 27 are formed by the first electrical conductor layer and are connected electrically to the predrivers 17 via contact holes 30 as well as to the power supply lines 25 via contact holes 29. The ground lines 28 are furnished all over the macro cell layout regions 9 in the second direction on another side of the regions (bottom side in FIGS. 14 and 15). The ground lines 28 are formed by the first electrical conductor layer and are connected electrically to the predrivers 17 via contact holes 31 as well as to the ground lines 26 via contact holes 32.

With the first embodiment, the clock drivers 15a and 15b are each shown comprising one predriver 17. However, this arrangement is exemplary and should not be construed as limiting the invention. A plurality of predrivers may be included in each clock driver. In such cases, the predrivers are formed predetermined distances apart and arranged in the first direction between power supply line pairs in each of at least two of the macro cell layout regions 9.

The first and the second main drivers 19(1) through 19(n) are formed predetermined distances apart, located along a single straight line in the first direction, and furnished to each of at least two (n in this setup) of the macro cell layout regions 9 except those in which the predrivers 17 are provided. That is, with the first embodiment, the main drivers 19 are furnished to all macro cell layout regions 9 except those comprising the predrivers 17. However, this arrangement is exemplary and should not be construed as limiting the invention. The arrangement of predrivers may be determined appropriately depending on the number of the main drivers configured.

Figure 16:
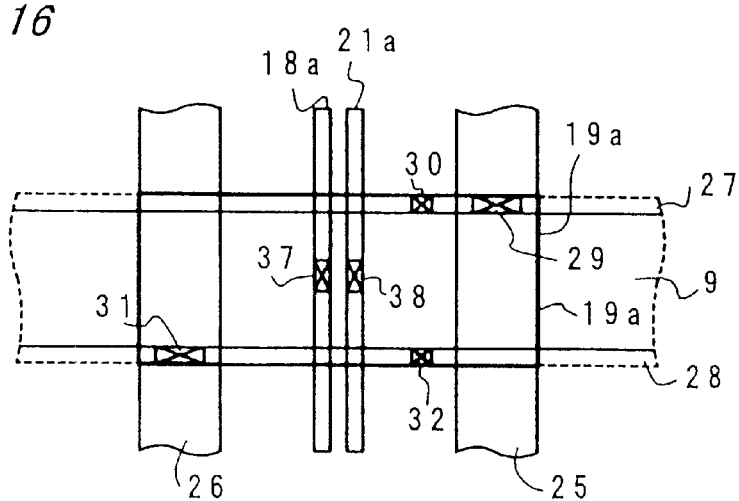
FIG. 16 is a partially enlarged plan pattern view of one of main drivers 19a(1) through 19a(n) shown in FIG. 13.
Figure 17:
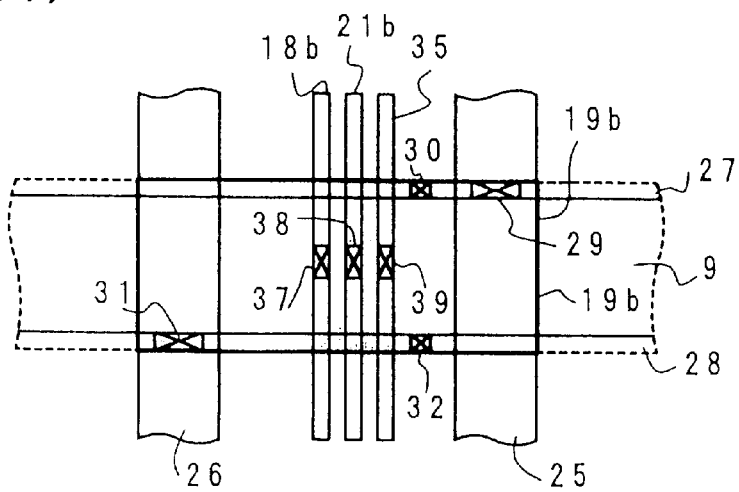
FIG. 17 is a partially enlarged plan pattern view of one of main drivers 19b(1) through 19b(n) shown in FIG. 13.

As shown in detail in FIG. 16 (an enlarged view of the portion B1 in FIG. 13) and FIG. 17 (an enlarged view of the portion B2 in FIG. 13), each of the first and second main drivers 19a and 19a is formed where each power supply line pair made of the power supply line 25 and ground line 26 intersects the macro cell layout region 9, i.e., each main driver 19 is formed in the macro cell layout region 9 between the power supply line 25 and ground line 26 constituting each power supply line pair. Each power supply line pair is formed in the second direction and located approximately in the middle of the function block layout region in question. In the respective function block layout regions, the main drivers 19 and predrivers 17 are formed along a single straight line in the first direction.

As in the case of predrivers 17, the wiring inside each main driver 19 is formed by at least one of first and second wiring, the first wiring being formed linearly in the second direction, the second wiring being arranged linearly in the first direction. Each main driver 19 may be readily formed between the power supply line 25 and its paired ground line 26.

In FIGS. 16 and 17, the length of each main driver 19 in the second direction is shown ranging from the outer periphery of the power supply line 25 to that of its paired ground line 26. However, this arrangement is exemplary and should not be construed as limiting the invention. Depending on its structure, the main driver 19 may alternatively be shorter than the distance between the outer periphery of the power supply line 25 and that of the paired ground line 26, as long as each main driver 19 is located between the power supply line 25 and the paired ground line 26 constituting the power supply line pair.

As illustrated in FIGS. 16 and 17, each of the first and second main drivers 19a and 19a is fed with the supply potential Vcc from the power supply line 25 via another power supply line 27; each main driver 19 is also supplied with the ground potential GND from the ground line 26 connected to the main driver via another ground line 28. The power supply lines 27 are connected electrically to the main drivers 19 via the contact holes 30 as well as to the power supply lines 25 via the contact holes 29. The ground lines 28 are connected electrically to the main drivers 19 via the contact holes 32 as well as to the ground lines 26 via the contact holes 31.

Figure 13:
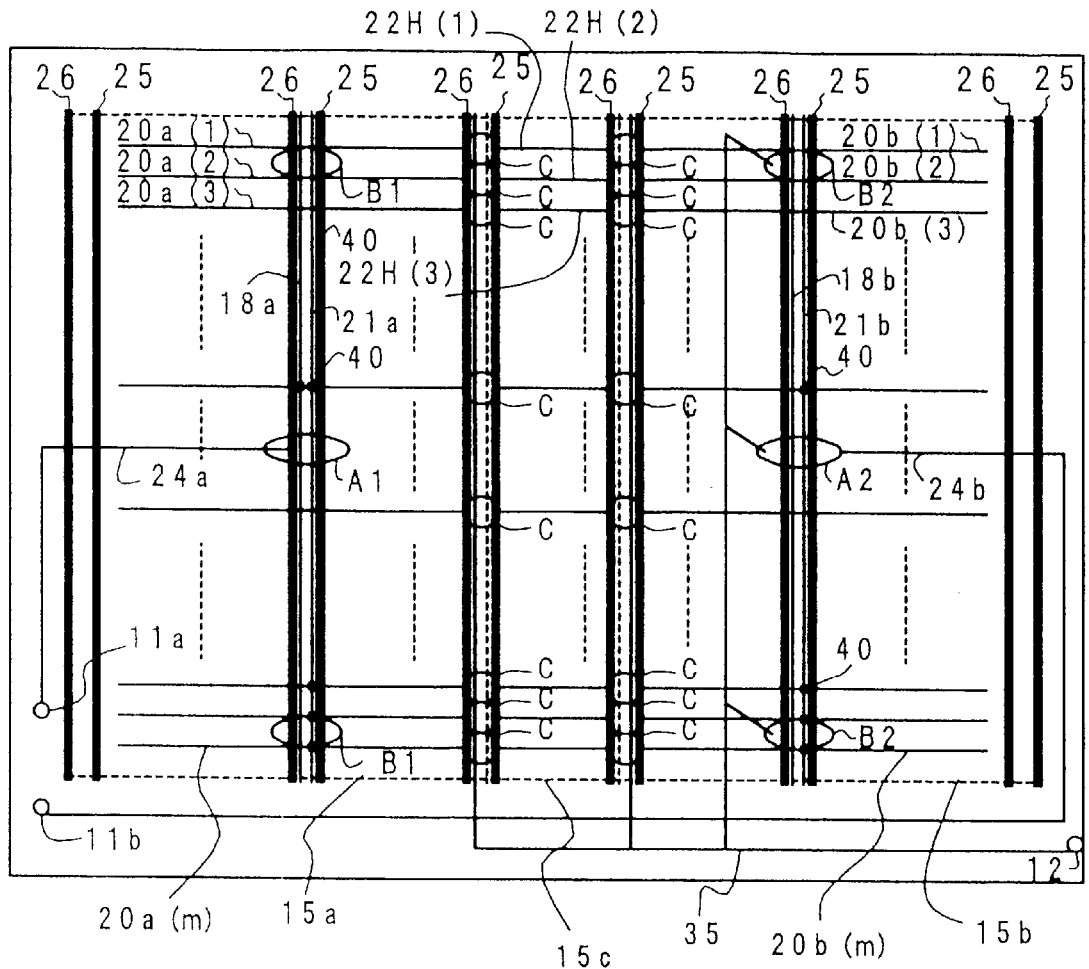
FIG. 13 is a schematic plan pattern view of the first embodiment of the present invention.

As shown in FIG. 13, the first common line 18 is arranged linearly in the first direction over the predriver 17 and a plurality of main drivers 19(1) through 19(n). The first common line 18 is formed by the second electrical conductor layer, and is located between the power supply line 25 and the paired ground line 26 making up a power supply line pair and in parallel with the paired lines. As depicted in FIGS. 14 and 15, the first common line 18 is connected electrically via a contact hole 34 to the output node of the predriver 17 in the corresponding function block. The first common line 18 is also connected electrically, as shown in FIGS. 16 and 17, to the input nodes of the main drivers 19(1) through 19(n) via contact holes 37 in the corresponding function block. These connections short-circuit the output node of the predriver 17 and the input nodes of the main drivers 19(1) through 19(n) in the respective function blocks.

As illustrated in FIG. 13, the second common line 21 is arranged linearly in the first direction over the predriver 17 and the plurality of main drivers 19(1) through 19(n) in the function block in question. The second common line 21 is formed by the second electrical conductor layer, and is located between the power supply line 25 and ground line 26 making up a power supply line pair and in parallel with the first common line 18. The second common line 21 is connected electrically, as shown in FIGS. 16 and 17, to the output nodes of the main drivers 19(1) through 19(n) via contact holes 38, whereby these output nodes are short-circuited.

The second common line 21 is greater in line width than the first common line 18. The reason for the enlarged width of the second common line 21 is as follows: the first common line 18 is connected to the input nodes of the plurality of main drivers 19(1) through 19(n). As shown in FIGS. 9 through 12, the input nodes IN are connected to the gate electrodes of P-type and N-type MOS transistors. Thus the load capacity connected to the first common line 18 is small. By contrast, the second common line 21 is connected to a plurality of clock signal supply lines 20(1) through 20(m) as well as to the clock input nodes of a plurality of internal circuits 16. This means that the load capacity connected to the second common line 21 is large.

As shown in FIGS. 14 and 15, the input node of the predriver 17 is connected to the clock signal input line 24 via a contact hole 33. The clock signal input line 24 is connected to the clock input terminal 11. The clock signal input line 24 is formed by the first and second electrical conductor layers.

As depicted in FIG. 15, the second predriver 17b has its control node connected to the control signal input line 35 via a contact hole 36. The control signal input line 35 is connected to the control signal input terminal 12. The control signal input line 35 is formed by the first and second electrical conductor layers.

As shown in FIG. 13, the plurality of clock signal supply lines 20(1) through 20(m) are arranged linearly in the second direction corresponding to each of a plurality of macro cell layout regions 9 each comprising a second macro cell 16 in the corresponding function block. In the corresponding function block of the first embodiment, all macro cell layout regions 9 are provided with clock signal supply lines 20 on a one-to-one basis. Alternatively, every contiguous pair of the macro cell layout regions 9 may be furnished with one clock signal supply line 20 in a two-to-one correspondence. As another alternative, the clock signal supply lines 20 may be provided only to those of the macro cell layout regions 9 which comprise the second macro cells 16. In the second alternative case, where any contiguous pair of macro cell layout regions 9 corresponds to one second macro cell 16, these two macro cell layout regions 9 may be provided with one clock signal supply line 20.

The clock signal supply lines 20(1) through 20(m) are formed by the first electrical conductor layer and are arranged in parallel with one another over the wiring region 10 in the corresponding function block. Each of the clock signal supply lines 20(1) through 20(m) has its middle portion connected electrically to the second common line 21 via a contact hole 40. The clock signal supply lines 20(1) through 20(m) are connected via wiring 41 to the clock input nodes of the internal circuits acting as the second macro cells 16 furnished to the respective macro cell layout regions 9 (see FIG. 3). The wiring 41 is formed by the second electrical conductor layer.

The connection means 22 is formed in the macro cell layout region 9 between a function block layout region comprising the first clock driver circuit 15a on the one hand, and a function block layout region including the second clock driver circuit 15b on the other hand. As shown in detail in FIG. 18, the connection means 22 is formed where each power supply line pair made of the power supply line 25 and ground line 26 intersects the macro cell layout region 9, i.e., the connection means 22 is formed in the macro cell layout region 9 between the power supply line 25 and ground line 26 constituting each power supply line pair. Each power supply line pair is formed in the second direction and located approximately in the middle.

Figure 18:
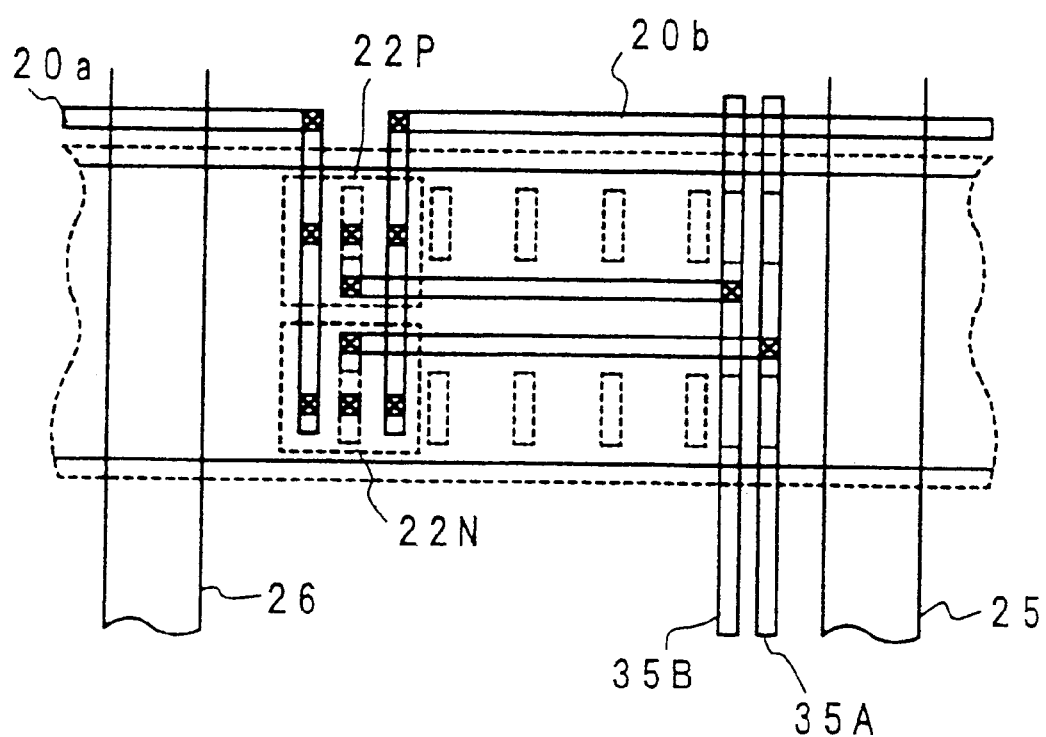
FIG. 18 is a partially enlarged plan pattern view of connection means 22 shown in FIG. 13.

As shown in FIG. 18 (an enlarged view of the portion C in FIG. 13), the transmission gate constituting each connector of the connection means 22 is composed of one basic cell located between the power supply line 25 and its paired ground line 26 making up each power supply line pair. The basic cell is in the macro cell layout region 9 close to the corresponding clock signal supply lines 20a and 20b. That is, each transmission gate is composed of a P-type MOS transistor 22P and an N-type MOS transistor 22N furnished in the first direction relative to the P-type MOS transistor 22P.

The P-type MOS transistor 22P and the N-type MOS transistor 22N constituting the connection means 22 have their main electrodes (source/drain regions) on one side commonly connected to an end of the corresponding clock signal supply line 20a in the first clock driver 15a. The main electrodes (source/drain regions) on the other side of the P- and N-type MOS transistors 22P and 22N are commonly connected to an end of the corresponding clock signal supply line 20b in the second clock driver 15b. The P-type MOS transistor 22P has its control electrode (i.e., gate electrode) connected to the output node of the inverter circuit 23 via wiring 35B formed by the second electrical conductor layer in parallel with the power supply line pairs. The control electrode (gate electrode) of the N-type MOS transistor 22N is connected to the control signal input terminal 12 via wiring 35A that constitutes part of the control signal input line 35 formed by the second electrical conductor layer in parallel with the power supply line pairs.

The inverter circuit 23 is formed in the macro cell layout region 9 between two function block layout regions, one function block layout region comprising the first clock driver circuit 15a, the other function block layout region including the second clock driver circuit 15b. The inverter circuits 23 should preferably be formed close to the wiring 35A and 35B. One basic cell between the power supply line 25 and its paired ground line 26 making up one power supply line pair constitutes one inverter circuit 23. That is, the inverter circuit 23 is composed of a P-type MOS transistor and an N-type MOS transistor arranged in the first direction relative to the P-type MOS transistor.

Alternatively, the inverter circuit 23 may be formed where each power supply line pair made of the power supply line 25 and ground line 26 intersects the macro cell layout region 9, the power supply line pair being approximately located centrally in the second direction. In this alternative arrangement, the wiring 35B is not necessary. The inverter circuit 23 and the connection means 22 may readily be furnished between the power supply line 25 and its paired ground line 26 constituting each power supply line pair.

In FIG. 13, any first macro cell acting as a logic circuit or any second macro cell 16 working as an internal circuit requiring a clock signal is omitted for purpose of illustration and simplification. In practice, the first and second macro cells fill up all macro cell layout regions 9 efficiently with no gap left (one basic cell generally does offer electrical insulation between two contiguous macro cells), with the exception of the regions between the power supply line 25 and ground line 26 making up each power supply line pair.

Although the first embodiment has been shown comprising the first and second clock drivers 15a and 15b, this arrangement is exemplary and should not be construed as limiting the invention. Alternatively, three or more clock driver circuits may be provided. In such cases, a plurality of function block layout regions may be furnished in the second direction and the connection means 22 may be provided between the contiguous function block layout regions. The function blocks each accommodating a clock driver circuit should preferably be of the same size.

In the above description, the input node of each predriver 17 was shown being connected to the clock input terminal 11 via the clock signal input line 38. Alternatively, there may be provided between the input node of the predriver 17 and the clock input terminal 11 a clock input driver comprising two inverter circuits, i.e., a driver having the same constitution as that of the predriver 17.

What follows is a description of how the clock driver circuit in the semiconductor integrated circuit device of the above-described constitution works in normal mode. The operation in normal mode continues from the time the first and second clock input terminals 11a and 11b are fed with separate clock signals, until a clock signal is input to the clock input node of the internal circuit acting as the second macro cell 16 in each of the function blocks.

Initially, the control signal input terminal 12 is supplied with a control signal denoting a first state (Low level) which represents normal mode for the first embodiment. The control signal places the connection means 22 in a disconnected state. This in turn disconnects electrically the plurality of clock signal supply lines 20a(1) through 20a(m) in the first clock driver 15a from the plurality of clock signal supply lines 20b(1) through 20b(m) in the second clock driver 15b. The second predriver 17b and the second main drivers 19b(1) through 19b(n) are activated upon receipt of the control signal representing the first state.

The first and second clock drivers 15a and 15b receive different clock signals but essentially operate in the same manner. Thus the description that follows will center on the workings of the first clock driver 15a.

When the first clock input terminal 11a receives an externally supplied clock signal, the signal is forwarded to the predriver 17a via the clock signal input line 24a. The predriver 17a outputs a clock signal derived from the input clock signal. The clock signal from the predriver 17a is fed to the first common line 18a which forwards the signal to the main drivers 19a(1) through 19a(n).

The input nodes of the main drivers 19a(1) through 19a(n) are short-circuited by the first common line 18a, and the load capacity on the first common line 18 is therefore small. This means that changes in the clock signal (i.e., rise and fall) become the same on the input nodes of the main drivers 19a(1) through 19a(n).

The output nodes of the main drivers 19a(1) through 19a(n) develop the same changes in the clock signal. Furthermore, the output nodes of the main drivers 19a(1) through 19a(n) which are arranged predetermined distances apart are connected in a distributed manner to the entire stretch of the second common line 21a. This arrangement causes the clock signal appearing along the entire stretch of the second common line 21a to change in the same fashion.

In short, the changes in the clock signal input to the clock input terminal 11 remain the same all along the second common line 21a. In other words, there is only a very limited presence of clock skews, i.e., temporal discrepancies for the clock signal having entered the clock input terminal 11 to reach the second common line 21a along its entire span.

The clock signal transmitted to the second common line 21a is supplied via the clock signal supply lines 20a(1) through 20a(m) to the clock input nodes of the internal circuits (second macro cells 16) each requiring a clock signal. In this case, the changes in the clock signal are the same at the points of connection between the clock signal supply lines 20a(1) through 20a(m) on the one hand, and the second common line 21a on the other hand, i.e., at the middle points of the clock signal supply lines. The changes in the clock signal at both ends of the clock signal supply lines 20a(1) through 20a(m) lag slightly behind those at their middle points. However, the delays are practically negligible and do not affect the overall operation.

The second clock driver 15b works in the same fashion as the first clock driver 15a. Thus the entire span of the second common line 21b is supplied with the clock signal input to the clock input terminal 12 entailing a very limited presence of clock skews. The clock signal with practically nonexistent clock skews having reached the second common line 21b is forwarded via the clock signal supply lines 20b(1) through 20b(m) to the clock input nodes of the internal circuits (second macro cells 16) each requiring a clock signal.

The clock driver circuit works in test mode (i.e., in scan test) as follows: first, the control signal input terminal 12 is fed a control signal denoting a second state (High level) which represents test mode for the first embodiment. The control signal places the connection means 22 in a connected state. This in turn connects electrically the clock signal supply lines 20a(1) through 20a(m) in the first clock driver 15a to the clock signal supply lines 20b(1) through 20b(m) in the second clock driver 15b.

The second predriver 17b and the second main drivers 19b(1) through 19b(n) are deactivated upon receipt of the control signal representing the second state. This means that, with the output nodes of the second predriver 17b and the second main drivers 19b(1) through 19b(n) placed in the electrically floating state (i.e., high-impedance state), a test-use clock signal that may be input to the second clock input terminal 11b still leaves the first and second common lines 18b and 21b unaffected.

When a test-use clock signal is externally fed to the first clock input terminal 11a, the signal is forwarded to the predriver 17a via the clock signal input line 24a. The predriver 17a outputs a clock signal derived from the input clock signal. The clock signal from the predriver 17a is supplied to the first common line 18a which in turn supplies the signal to the main drivers 19a(1) through 19a(n).

With the first embodiment, the first common line 18a is formed by an aluminum layer thicker than ordinary wiring. The thickened layer structure makes it possible both to reduce the resistance value of the first common line 18a and to decrease the load capacity on that line. As a result, changes in the test-use clock signal (i.e., rise and fall) become the same on those input nodes of the main drivers 19a(1) through 19a(n) which are short-circuited by the first common line 18a.

The output nodes of the main drivers 19a(1) through 19a(n) develop the same changes in the test-use clock signal. Furthermore, the output nodes of the main drivers 19a(1) through 19a(n) which are arranged predetermined distances apart are connected in a distributed manner to the entire span of the second common line 21a. This arrangement causes the test-use clock signal appearing along the entire span of the second common line 21a to change in the same fashion.

In short, the changes in the test-use clock signal input to the clock input terminal 11 remain the same all along the second common line 21a. In other words, there is only a very limited presence of clock skews, i.e., temporal discrepancies for the test-use clock signal having entered the clock input terminal 11 to reach the second common line 21a along its entire span.

The clock signal transmitted to the second common line 21a is supplied, through the clock signal supply lines 20a(1) through 20a(m) as well as the clock signal supply lines 20b(1) through 20b(m) connected electrically to the clock signal supply lines 20a(1) through 20a(m) via the connection means 22, to the clock input nodes of the internal circuits (second macro cells 16) each requiring a clock signal.

In the case above, the changes in the clock signal are the same at the points of connection between the clock signal supply lines 20a(1) through 20a(m) on the one hand, and the second common line 21a on the other hand, i.e., at the middle points of the clock signal supply lines. The changes in the clock signal at both ends of the clock signal supply lines lag slightly behind those at their middle points. The changes in the clock signal on the clock signal supply lines 20b(1) through 20b(m) connected electrically to the clock signal supply lines 20a(1) through 20a(m) via the connection means 22 lag slightly behind the signal changes at the middle points of the clock signal supply lines 20a(1) through 20a(m). However, the delays are practically negligible and do not affect the overall operation.

In the manner described, all second macro cells 16 connected in series between the scan data input terminal 13 and the scan data output terminal 14 receive the test-use clock signal entailing practically negligible clock skews. Thus, the test data input to the scan data input terminal 13 is shifted successively in synchronism with the test-user clock signal and output to the scan data output terminal 14.

As described, the first embodiment of the invention provides the following major advantages:

(A) In normal mode, clock signals input to the clock input terminals 11a and 11b for the first and second clock drivers 15a and 15b change in the same manner along the entire spans of the second common lines 21a and 21b. Thus all second macro cells 16 working as internal circuits requiring a clock signal each are supplied with clock signals with practically negligible clock skews.

(B) In test mode, the changes in the clock signal input to the clock input terminal 11a remain the same all along the second common line 21a in the first clock driver 15a. Clock skews are thus made practically negligible along the clock signal supply lines 20a(1) through 20a(m) as well as along the clock signal supply lines 20b(1) through 20b(m) connected to the clock signal supply lines 20a(1) through 20a(m) via the connection means 22. As a result, all second macro cells 16 are supplied with the test-use clock signal with negligible clock skews.

(C) The predrivers 17a and 17b and the main drivers 19a(1) through 19a(n) as well as 19b(1) through 19b(n) making up the first and second clock drivers 15a and 15b are located between the power supply line 25 and the ground line 26 constituting each of the power supply line pairs that exclude the first and second macro cells. This arrangement allows the clock driver circuits to be located inside the cell regions 2 without reducing the number of the first and second macro cells in these regions.

Second Embodiment

Figure 19:
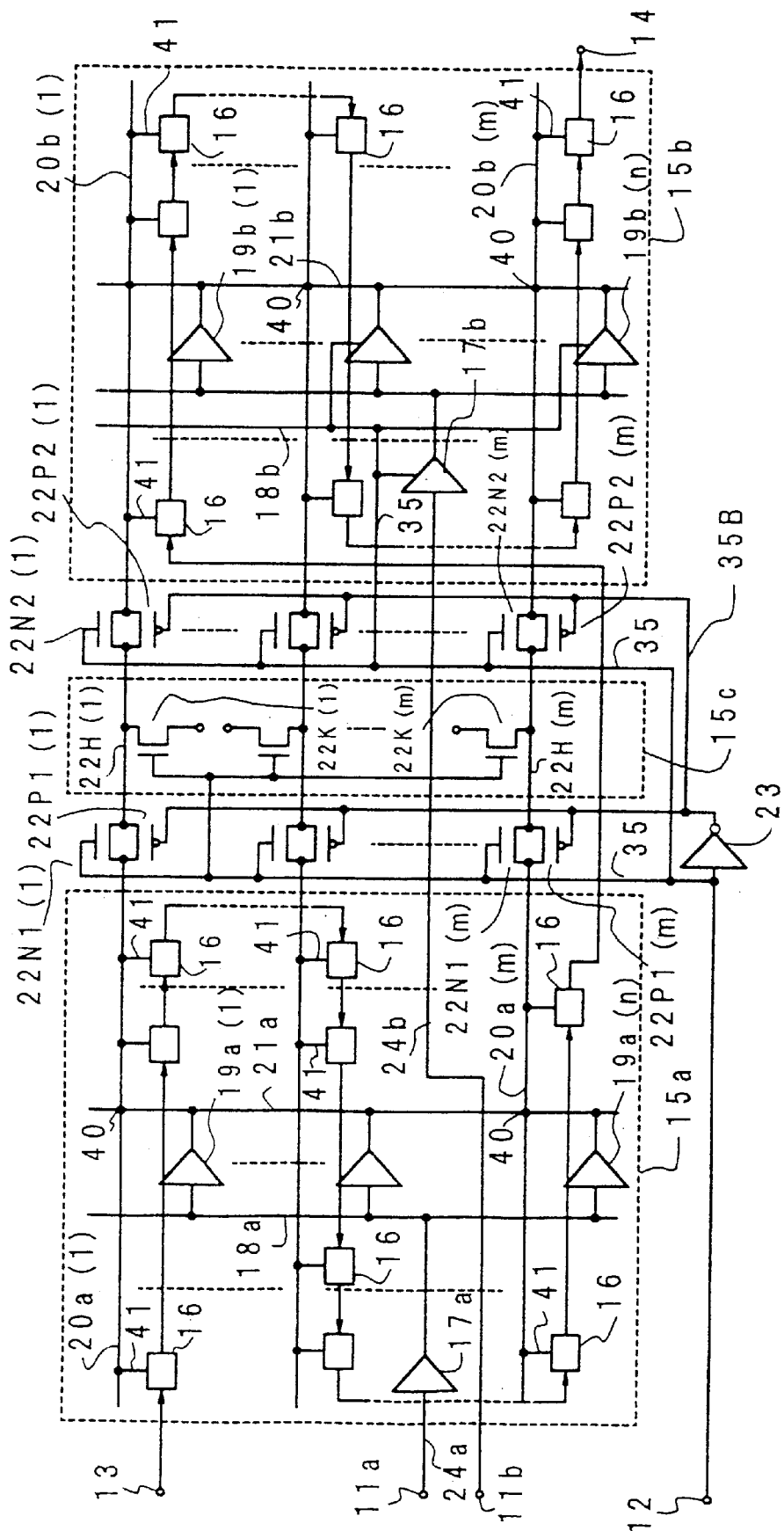
FIG. 19 is a circuit diagram of a second embodiment of the present invention.
Figure 20:
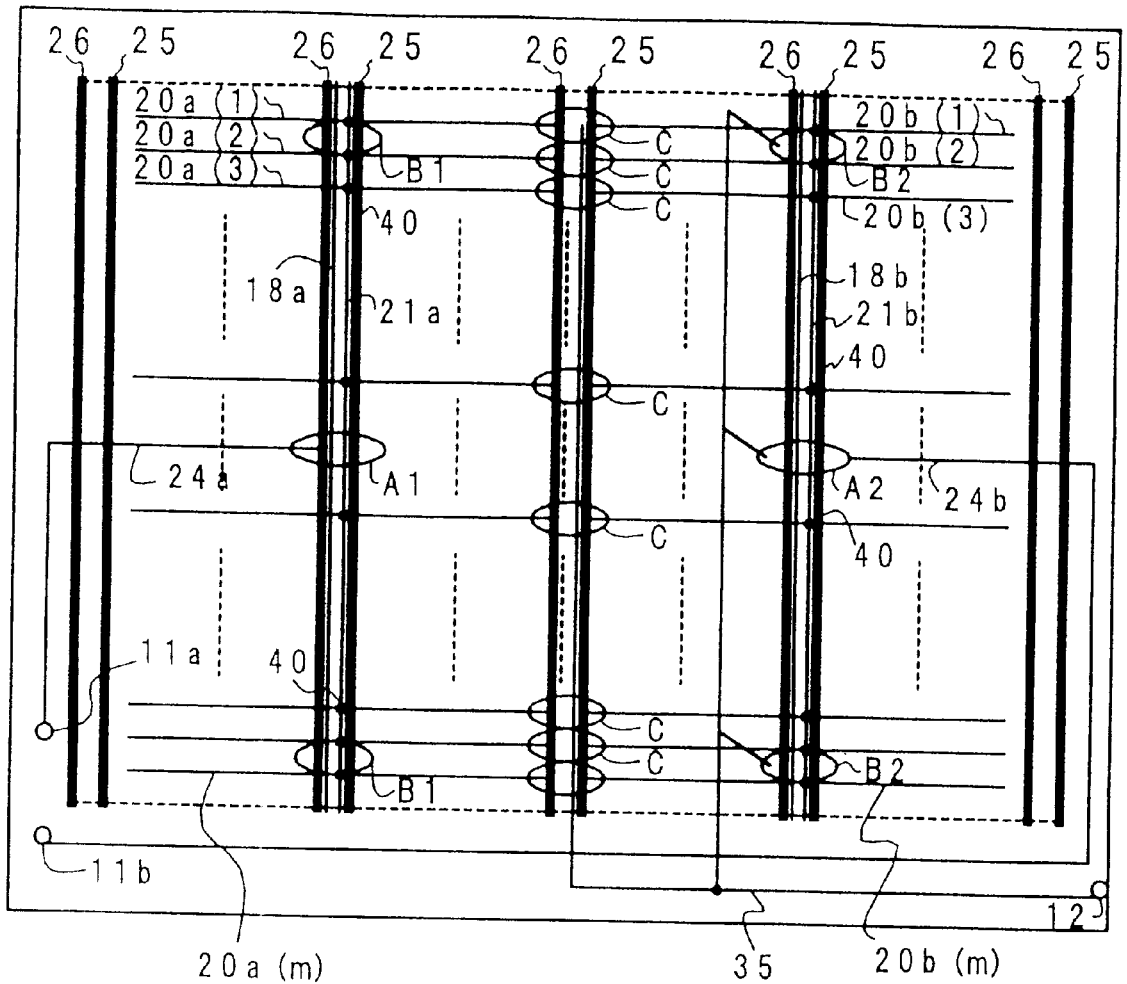
FIG. 20 is a schematic plan pattern view of the second embodiment of the present invention.
Figure 21:
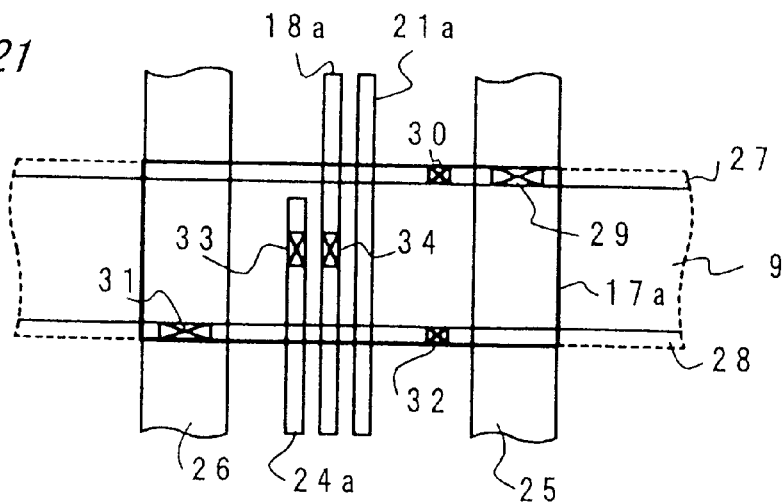
FIG. 21 is a partially enlarged plan pattern view of the connection means 22 shown in FIG. 19.
Figure 22:
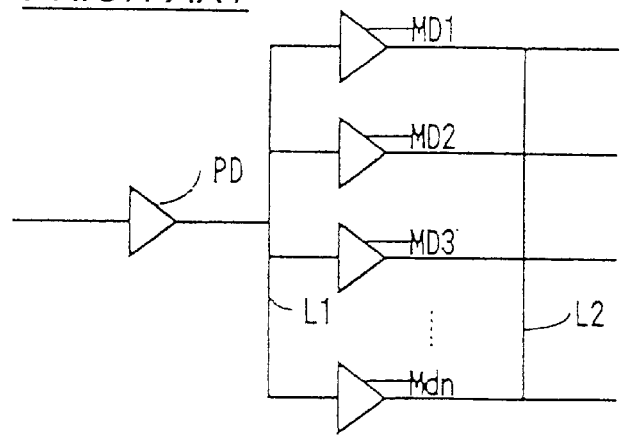
FIG. 22 is a circuit diagram of a conventional clock driver circuit.
Figure 23:
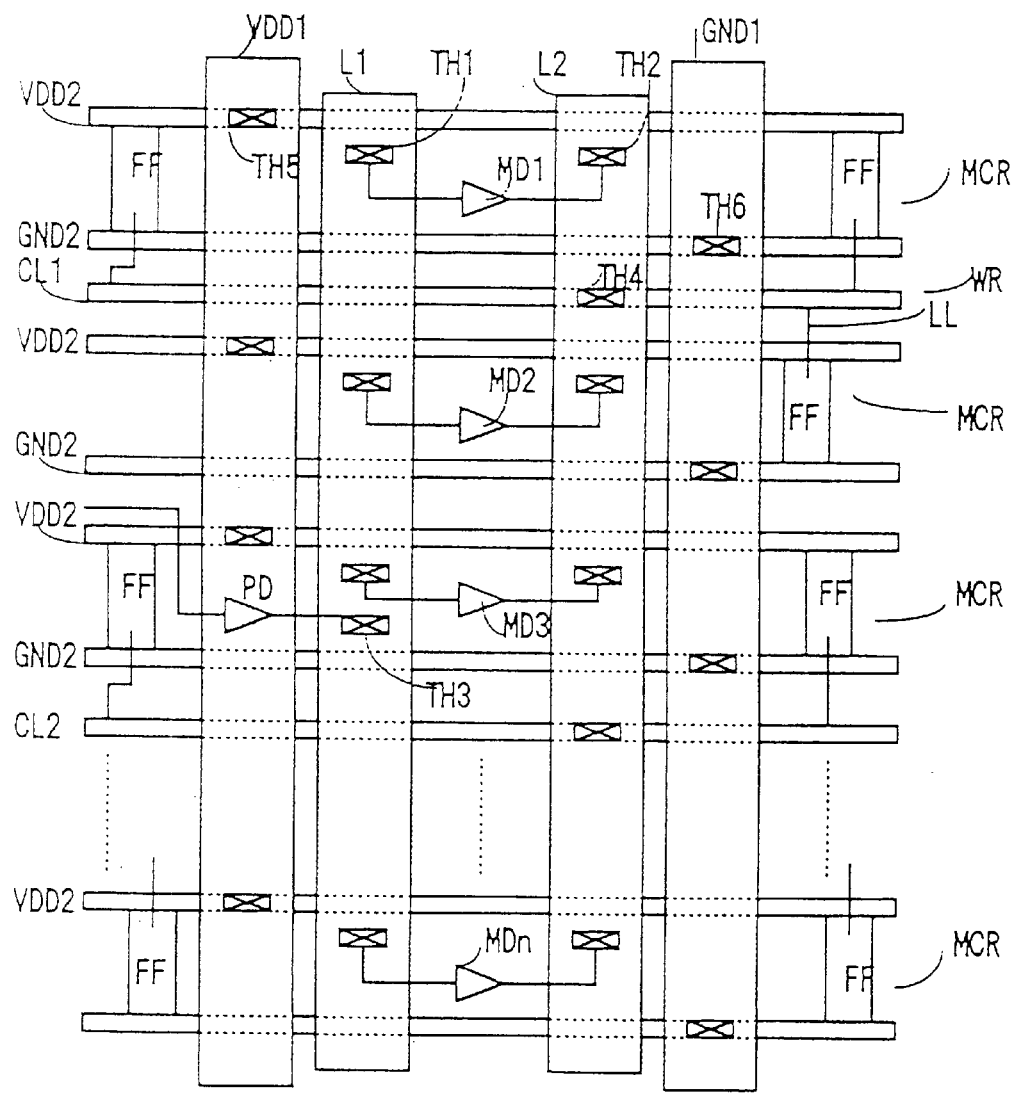
FIG. 23 is a partial plan pattern view of a conventional clock driver circuit arrangement.
Figure 24:
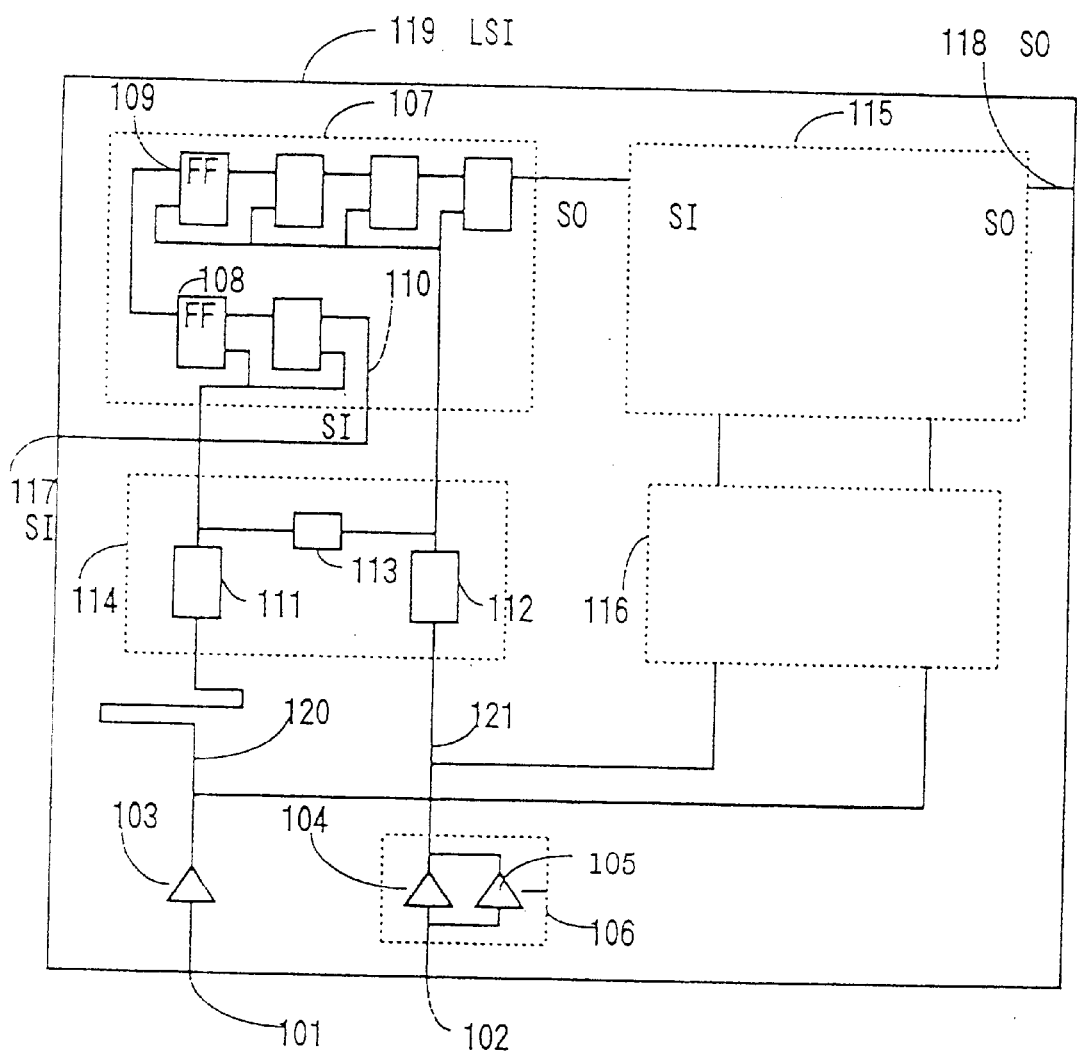
FIG. 24 is a block diagram of a conventional clock signal wiring arrangement.

A second embodiment of the present invention is illustrated in FIGS. 19 through 21. The second embodiment is structurally identical to the first embodiment with the exception of the connection means 22. Thus the description that follows will center on the connection means 22.

In the second embodiment, a function block layout region 15c with no internal macro cell requiring a clock signal, i.e., a function block without the need for any clock driver, is located in interposing fashion between the function block layout region including the first clock driver 15a on the one hand, and the function block layout region comprising the second clock driver 15b on the other hand. In FIGS. 19 through 21, like reference numerals designate like or corresponding parts included in both the first and the second embodiment.

As shown in FIG. 19, the connection means 22 has connectors furnished corresponding to the clock signal supply lines 20a(1) through 20a(m) and to the clock signal supply lines 20b(1) through 20b(m) for the first and second clock drivers 15a and 15b. Each connector has a first transmission gate (made of 22P1, 22N1), a second transmission gate (22P2, 22N2), connection wiring 22H and fixed potential supply means 22K.

Each first transmission gate is formed in the macro cell layout region 9 between the power supply line 25 and ground line 26 constituting each power supply line pair located close to an end of the corresponding clock signal supply line 20a in the first clock driver 15a (see portion C in FIG. 20).

The first transmission gate has a P-channel MOS transistor 22P1 and an N-channel MOS transistor 22N1 connected in parallel. The P- and N-channel MOS transistors 22P1 and 22N1 have their main electrodes (source/drain regions) on one side commonly connected to an end of the clock signal supply line 20a in the first clock driver 15a, as shown in FIG. 21 (which shows an enlarged view of the portion C in FIG. 20). The control electrode of the P-channel MOS transistor 22P1 is connected via the inverter circuit 23 and control signal input line 35 to the control signal input terminal 12, as shown in FIGS. 19 and 21. The control electrode receives a test mode signal that serves as a control signal. Likewise, the N-channel MOS transistor 22N1 has its control electrode connected to the control signal input terminal 12 via the control signal input line 35. This control electrode also receives the control signal, i.e., the test mode signal.

The control signal input line 35 is furnished between the power supply line 25 and ground line 26 constituting each power supply line pair to which the first transmission gate is furnished. The control signal input line 35 is arranged in parallel with the power supply line 25 and is formed in part by the second electrical conductor layer.

Each second transmission gate is formed in the macro cell layout region 9 between the power supply line 25 and ground line 26 constituting each power supply line pair located close to an end of the corresponding clock signal supply line 20b in the second clock driver 15b (see the portion C in FIG. 20).

The second transmission gate has a P-channel MOS transistor 22P2 and an N-channel MOS transistor 22N2 connected in parallel. The P- and N-channel MOS transistors 22P2 and 22N2 have their main electrodes (source/drain regions) on one side commonly connected to an end of the clock signal supply line 20b in the second clock driver 15b, as shown in FIG. 21. The control electrode of the P-channel MOS transistor 22P2 is connected via the inverter circuit 23 and control signal input line 35 to the control signal input terminal 12, as shown in FIGS. 19 and 21. The control electrode receives the test mode signal that serves as the control signal. Likewise, the N-channel MOS transistor 22N2 has its control electrode connected to the control signal input terminal 12 via the control signal input line 35. This control electrode also receives the control signal (i.e., test mode signal).

The control signal input line 35 is provided between the power supply line 25 and ground line 26 constituting each power supply line pair to which the second transmission gate is furnished. The control signal input line 35 is arranged in parallel with the power supply line 25 and is formed in part by the second electrical conductor layer.

As depicted in FIGS. 19 through 21, the connection wiring 22H is furnished to the corresponding clock signal supply lines 20a and 20b in the first and second clock drivers 15a and 15b. The connection wiring 22H is arranged linearly in the second direction over the function block layout region and is formed by the first electrical conductor layer.

One end of the connection wiring 22H is connected to the other end of the first transmission gate, i.e., to the main electrodes (source/drain regions) on the other side of the first transmission gate to which the P- and N-channel MOS transistors 22P1 and 22N1 are commonly connected. The other end of the connection wiring 22H is connected to the other end of the second transmission gate, i.e., to the main electrodes (source/drain regions) on the other side of the second transmission gate to which the P- and N-channel MOS transistors 22P2 and 22N2 are commonly connected.

The fixed potential supply means 22K is made of a P-channel MOS transistor connected in interposing fashion between a power supply node (specifically the power supply line 27) and the connection wiring 22H. The control electrode of the P-channel MOS transistor is connected to the control signal input terminal 12 via the control signal input line 35, and receives the test mode signal that is the control signal. When the control signal denotes normal mode, the fixed potential supply means 22K conducts to feed a supply potential (fixed potential) to the connection wiring 22H. The conduction fixes the connection wiring 22H to the supply potential so that it will not affect the macro cells. The fixed potential supply means 22K does not conduct when the control signal represents test mode.

Between the power supply line 25 and ground line 26 making up a power supply line pair corresponding to each first transmission gate, there is provided a P-channel MOS transistor constituting the fixed potential supply means 22K together with the first transmission gate. Alternatively, between the power supply line 25 and ground line 26 forming a power supply line pair matching each second transmission gate, there may be provided another P-channel MOS transistor constituting the fixed potential supply means 22K together with the second transmission gate.

With the clock driver circuit of the above-described constitution, as in the case of the first embodiment, the connection means 22 disconnects the clock signal supply lines 20a(1) through 20a(m) of the first clock driver 15a from the clock signal supply lines 20b(1) through 20b(m) of the second clock driver circuit 15b in normal mode, and connects these lines in test mode. This makes it possible for the second embodiment to provide the same advantages (A) through (C) of the first embodiment and to supplement them with another benefit (D):

(D) The connection means 22 has a transmission gate furnished to an end of each of the clock signal supply lines 20a(1) through 20a(m) as well as 20b(1) through 20b(m). In normal mode, this arrangement allows the connection means 22 to minimize any increase in the parasitic capacity of the clock signal supply lines 20a(1) through 20a(m) as well as 20b(1) through 20b(m).

In the second embodiment, the fixed potential supply means 22K feeds the supply potential. Alternatively, the fixed potential supply means 22K may feed ground potential instead.

Obviously, numerous additional modifications and variations of the present invention are possible in light of the above teachings. It is therefore to be understood that within the scope of the appended claims, the present invention may be practiced otherwise than as specifically described herein.

I claim:

1. A clock driver circuit comprising:
    a plurality of clock input terminals for each receiving a respective clock signal; and
    a plurality of clock drivers furnished corresponding to said plurality of clock input terminals;
    wherein each of said plurality of clock drivers includes:
        a predriver with an input node for receiving the clock signal input to the corresponding clock input terminal;
        a plurality of main drivers;
        a first common line connected electrically to input nodes of said plurality of main drivers and to an output node of said predriver;
        a second common line connected electrically to output nodes of said plurality of main drivers; and
        a plurality of clock signal supply lines connected to clock input nodes of circuits each requiring a clock signal, said plurality of clock signal supply lines being further connected electrically to said second common line; and
    wherein said clock driver circuit further comprises connection means having a plurality of connectors furnished between said plurality of corresponding clock signal supply lines of said plurality of clock drivers, said plurality of connectors electrically disconnecting the corresponding clock signal supply lines between said plurality of clock drivers when a control signal is found to denote a first state, said plurality of connectors further connecting electrically said corresponding clock signal supply lines of said plurality of clock drivers when the control signal is found to represent a second state.

2. A clock driver circuit according to claim 1, wherein the main drivers of said plurality of clock drivers are activated when said control signal denotes said first state, and wherein said main drivers of said plurality of clock drivers with the exception of one clock driver are deactivated when said control signal represents said second state.

3. A clock driver circuit according to claim 1, wherein said plurality of clock drivers are formed on a principal plane of a semiconductor substrate;
    wherein said first and said second common lines of each of said plurality of clock drivers are arranged linearly in a first direction on said principal plane of said semiconductor substrate;
    wherein said plurality of clock signal supply lines of each of said plurality of clock drivers are arranged in parallel with one another and in a second direction perpendicularly intersecting said first direction on said principal plane of said semiconductor substrate; and
    wherein said plurality of main drivers of each of said plurality of clock drivers are arranged predetermined distances apart and in said first direction on said principal plane of said semiconductor substrate.

4. A clock driver circuit according to claim 3, wherein said predriver and said plurality of main drivers of each of said plurality of clock drivers are arranged along a single straight line.

5. A clock driver circuit according to claim 3, wherein the central portion of each clock signal supply line of each of said plurality of clock drivers is electrically connected to said second common line.

6. A clock driver circuit according to claim 3, wherein said plurality of clock drivers are arranged in said second direction on said principal plane of said semiconductor substrate.

7. A clock driver circuit according to claim 6, wherein each connector of said connection means has a transmission gate located in interposing fashion between two contiguous clock drivers, one end of said transmission gate being connected to an end of the clock signal supply line corresponding to one of said contiguous clock drivers, the other end of said transmission gate being connected to an end of the clock signal supply line corresponding to the other contiguous clock driver, said transmission gate having a control electrode for receiving said control signal, said transmission gate comprising a P-channel MOS transistor and an N-channel MOS transistor connected in parallel.

8. A clock driver circuit according to claim 6, wherein each connector of said connection means comprises:
    a first transmission gate located in interposing fashion between two contiguous clock drivers, one end of said first transmission gate being connected to the clock signal supply line corresponding to one of said two contiguous clock drivers, said first transmission gate having a control electrode for receiving said control signal, said first transmission gate comprising a P-channel MOS transistor and an N-channel MOS transistor connected in parallel;
    a second transmission gate located in interposing fashion between said two contiguous clock drivers, one end of said second transmission gate being connected to the clock signal supply line corresponding to the other contiguous clock driver, said second transmission gate having a control electrode for receiving said control signal, said second transmission gate comprising a P-channel MOS transistor and an N-channel MOS transistor connected in parallel; and
    connection wiring located in interposing fashion between said two contiguous clock drivers, one end of said connection wiring being connected to the other end of the corresponding first transmission gate, the other end of said connection wiring being connected to the other end of the corresponding second transmission gate.

9. A semiconductor integrated circuit device comprising:
    a semiconductor substrate having a plurality of macro cell layout regions arranged in a first direction on a principal plane of the substrate; and
    a plurality of electrode pairs arranged in a second direction perpendicularly intersecting said first direction in each of said plurality of macro cell layout regions of said semiconductor substrate;
    wherein each of said plurality of macro cell layout regions includes a plurality of N-type diffusion areas each oriented in said second direction and a plurality of P-type diffusion areas each oriented in said second direction, said plurality of N-type diffusion areas and said plurality of P-type diffusion areas being formed collectively in said first direction;
    wherein each of said plurality of electrode pairs is made up of a first and a second electrode, said first electrode being formed together with an interposing insulation film between a contiguous pair of said plurality of N-type diffusion areas furnished in each of said plurality of macro cell layout regions, said second electrode being formed together with an interposing insulation film between a contiguous pair of said plurality of P-type diffusion areas which are arranged along with said first electrode in said first direction and which are furnished in the macro cell layout region in question;

wherein each of said plurality of electrode pairs and the N- and P-type diffusion layers located on both sides of the electrode pair in question constitute a basic cell;

wherein a first macro cell which is made up of a predetermined number of contiguous basic cells and which acts as a logic circuit is furnished to each of said plurality of macro cell layout regions on said semiconductor substrate;

wherein a second macro cell which is made up of a predetermined number of contiguous basic cells and which acts as a circuit requiring a clock signal is furnished to each of at least two of said plurality of macro cell layout regions;

wherein said plurality of macro cell layout regions on said semiconductor substrate are divided into a plurality of portions, each of the divided portions being provided with a clock driver and a clock input terminal for receiving a respective clock signal;

wherein each of the clock drivers in the corresponding divided portion comprises:

a predriver composed of a predetermined number of contiguous basic cells furnished to the corresponding macro cell layout region on said semiconductor substrate;

a plurality of main drivers which are composed of a predetermined number of contiguous basic cells, which are arranged along a single straight line with said predrivers, said plurality of main drivers being furnished to each of at least two macro cell layout regions other than those provided with the predrivers on said semiconductor substrate;

a first common line formed linearly in said first direction on said predriver and said plurality of main drivers furnished to the divided portion in question, said first common line being electrically connected to an output node of said predriver and to input nodes of said plurality of main drivers furnished to the divided portion in question;

a second common line formed linearly in said first direction on said predriver and said plurality of main drivers furnished to the corresponding divided portion, said second common line being electrically connected to output nodes of said plurality of main drivers in the corresponding divided portion; and a plurality of clock signal supply lines corresponding to said plurality of macro cell layout regions each having said second macro cells in the corresponding divided portion, said plurality of clock signal supply lines being linearly arranged in said second direction and connected electrically to said second common line, said plurality of clock signal supply lines being further connected electrically to each clock input node of said second macro cells furnished to the corresponding macro cell layout regions; and wherein said semiconductor integrated circuit device further comprises connection means located in interposing fashion between two contiguous clock drivers, said connection means electrically disconnecting the corresponding clock signal supply lines of said two contiguous clock drivers when a control signal is found to denote a first state, said connection means further connecting electrically said corresponding clock signal supply lines of said two contiguous clock drivers when said control signal is found to represent a second state.

10. A semiconductor integrated circuit device according to claim 9, wherein the main drivers of said plurality of clock drivers are activated when said control signal denotes said first state, and wherein said main drivers of said plurality of clock drivers are deactivated with the exception of one clock driver when said control signal represents said second state.

11. A semiconductor integrated circuit device according to claim 9, wherein said first and said second common lines are located in the central portion in said second direction of each of said divided portions; and wherein the central portion of said plurality of clock signal supply lines furnished to the divided portion in question is electrically connected to said second common line in the corresponding divided portion.

12. A semiconductor integrated circuit device according to claim 9, wherein each of said divided portions comprises at least one power supply line pair composed of a power supply line fed with a supply potential and of a ground line adjacent to and in parallel with said power supply line and fed with a ground potential, said power supply line pair being linearly formed in said first direction on said principal plane of said semiconductor substrate; and wherein said predriver and said plurality of main drivers in each of said divided portions are located between said power supply line and said ground line constituting said one power supply line pair furnished to the corresponding divided portion.

13. A semiconductor integrated circuit device according to claim 9, wherein wiring inside each of the first macro cells, wiring inside each of the second macro cells, wiring between said first macro cells, and wiring between said first macro cells on the one hand and said second macro cells on the other hand are constituted by at least one of first and second wiring, said first wiring being arranged in said second direction and formed by a first electrical conductor layer on said plurality of electrode pairs, said second wiring being arranged in said first direction and formed by a second electrical conductor layer different from said first electrical conductor layer;

wherein said first and said second common lines are formed by said second electrical conductor layer; and wherein said plurality of clock signal supply lines are formed by said first electrical conductor layer.

14. A semiconductor integrated circuit device according to claim 9, wherein said plurality of macro cell layout regions on said semiconductor substrate are divided into a plurality of portions in said second direction;

wherein said connection means has connectors each furnished with a transmission gate located in interposing fashion between two contiguous divided portions and composed of a predetermined number of contiguous basic cells, one end of said transmission gate being connected to an end of the clock signal supply line corresponding to the clock driver furnished to one of said two contiguous divided portions, the other end of said transmission gate being connected to an end of the clock signal supply line corresponding to the clock driver furnished to the other contiguous divided portion, said transmission gate having a control electrode for receiving said control signal.

15. A semiconductor integrated circuit device according to claim 9, wherein said plurality of macro cell layout regions on said semiconductor substrate are divided into a plurality of portions in said second direction;

wherein said connection means has connectors each
including:
- a first transmission gate located close to one of two contiguous divided portions and composed of a predetermined number of contiguous basic cells, one end of said first transmission gate being connected to an end of the clock signal supply line corresponding to the clock driver furnished to one of said two contiguous divided portions, said first transmission gate having a control electrode for receiving said control signal;
- a second transmission gate located close to the other one of said two contiguous divided portions and composed of a predetermined number of contiguous basic cells, one end of said second transmission gate being connected to an end of the clock signal supply line corresponding to the clock driver furnished to the other one of said two contiguous divided portions, said second transmission gate having a control electrode for receiving said control signal; and
- connection wiring having one end thereof connected to the other end of said first transmission gate, the other end of said connection wiring being connected to the other end of said second transmission gate.

* * * * *